(12) United States Patent
Cheon

(10) Patent No.: US 11,678,489 B2
(45) Date of Patent: Jun. 13, 2023

(54) THREE-DIMENSIONAL FLASH MEMORY DEVICE INCLUDING CHANNEL STRUCTURES HAVING ENLARGED PORTIONS

(71) Applicant: SAMSUNG ELECTRONICS CO., LTD., Suwon-si (KR)

(72) Inventor: Jisung Cheon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 10 days.

(21) Appl. No.: 17/532,271

(22) Filed: Nov. 22, 2021

(65) Prior Publication Data

US 2022/0085068 A1  Mar. 17, 2022

Related U.S. Application Data

(63) Continuation of application No. 16/589,206, filed on Oct. 1, 2019, now Pat. No. 11,189,631.

(30) Foreign Application Priority Data

Jun. 20, 2019  (KR) .................. 10-2019-0073628

(51) Int. Cl.
*H01L 23/528* (2006.01)
*H01L 27/11582* (2017.01)
(Continued)

(52) U.S. Cl.
CPC .... *H01L 27/11582* (2013.01); *H01L 23/5226* (2013.01); *H01L 23/5283* (2013.01); *H01L 27/11556* (2013.01)

(58) Field of Classification Search
CPC .......... H01L 27/11582; H01L 23/5226; H01L 23/5283; H01L 27/11556; H01L 27/11575;
(Continued)

(56) References Cited

U.S. PATENT DOCUMENTS 9,576,967 B1  2/2017 Kimura et al.
9,691,781 B1  6/2017 Nishikawa et al.
(Continued)

FOREIGN PATENT DOCUMENTS

KR   10-2017-0061646 A   6/2017

*Primary Examiner* — Karen Kusumakar
*Assistant Examiner* — Adam S Bowen
(74) *Attorney, Agent, or Firm* — Lee IP Law, P.C.

(57) ABSTRACT

A three-dimensional flash memory device including a lower and upper word line stack; a cell channel structure; and a dummy channel structure, wherein the cell channel structure includes a lower cell channel structure; an upper cell channel structure; and a cell channel enlarged portion between the lower and upper cell channel structures and having a width greater than that of the lower cell channel structure, wherein the dummy channel structure includes a lower dummy channel structure; an upper dummy channel structure; and a dummy channel enlarged portion between the lower and upper dummy channel structures, the dummy channel enlarged portion having a width greater than that of the lower dummy channel structure, wherein a difference between the width of the dummy channel enlarged portion and the lower dummy channel structure is greater than a difference between the width of the cell channel enlarged portion and the lower cell channel structure.

20 Claims, 37 Drawing Sheets

(51) Int. Cl.
*H01L 23/522* (2006.01)
*H01L 27/11556* (2017.01)

(58) Field of Classification Search
CPC ......... H01L 27/11568; H01L 27/11578; H01L 29/40117; H01L 29/792
See application file for complete search history.

(56) References Cited

U.S. PATENT DOCUMENTS

| | | |
|---|---|---|
| 9,741,738 B2 | 8/2017 | Fukuzumi et al. |
| 9,960,181 B1 | 5/2018 | Cui et al. |
| 10,114,590 B1 | 10/2018 | Wicklein |
| 10,672,780 B1* | 6/2020 | Kawamura ....... H01L 21/76802 |
| 2015/0236038 A1 | 8/2015 | Pachamuthu et al. |
| 2018/0151497 A1 | 5/2018 | Makala et al. |
| 2019/0280000 A1* | 9/2019 | Nakamura ........ H01L 27/11582 |
| 2020/0035699 A1 | 1/2020 | Liu et al. |
| 2020/0127006 A1* | 4/2020 | Otsu ................. H01L 21/76802 |

* cited by examiner

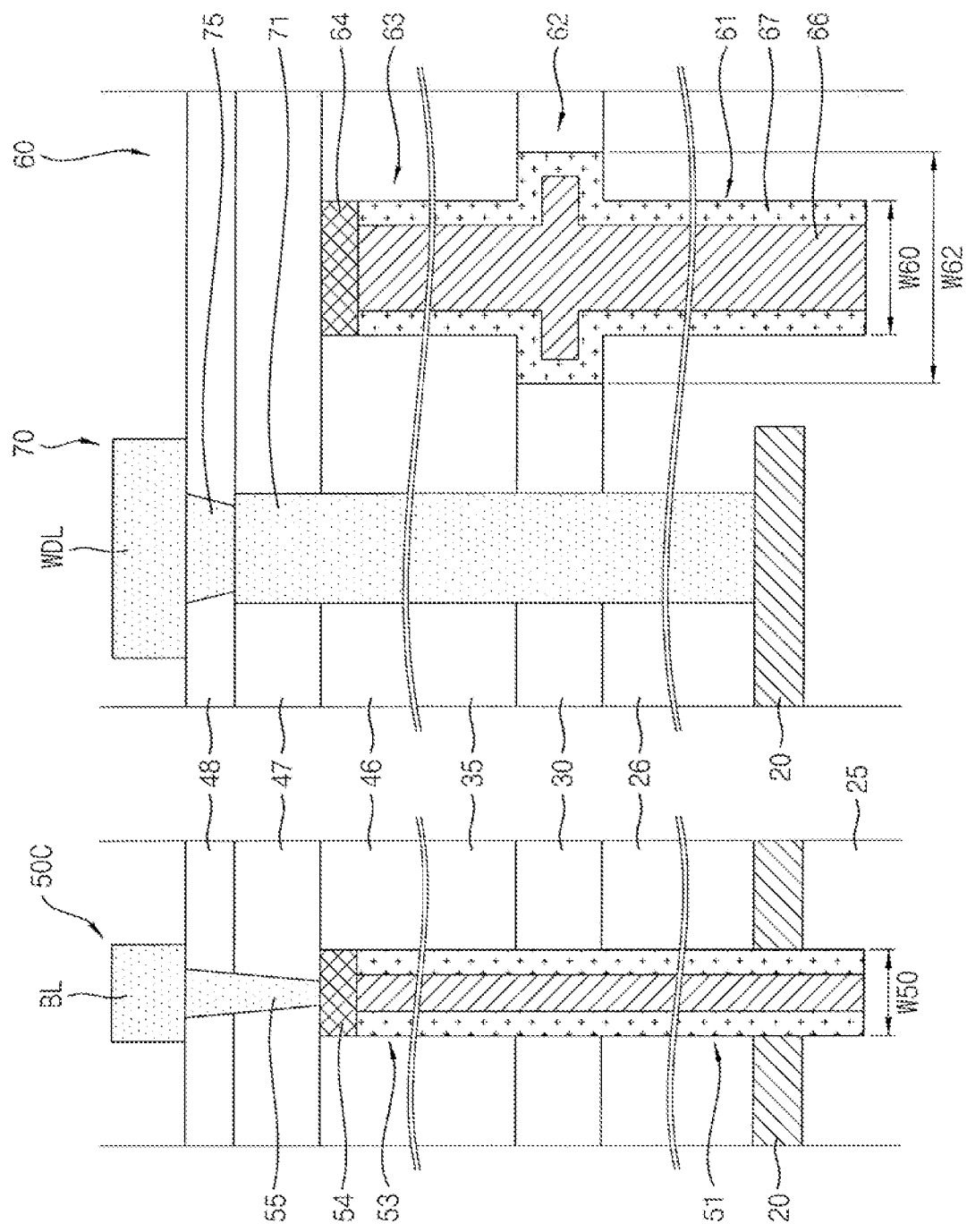

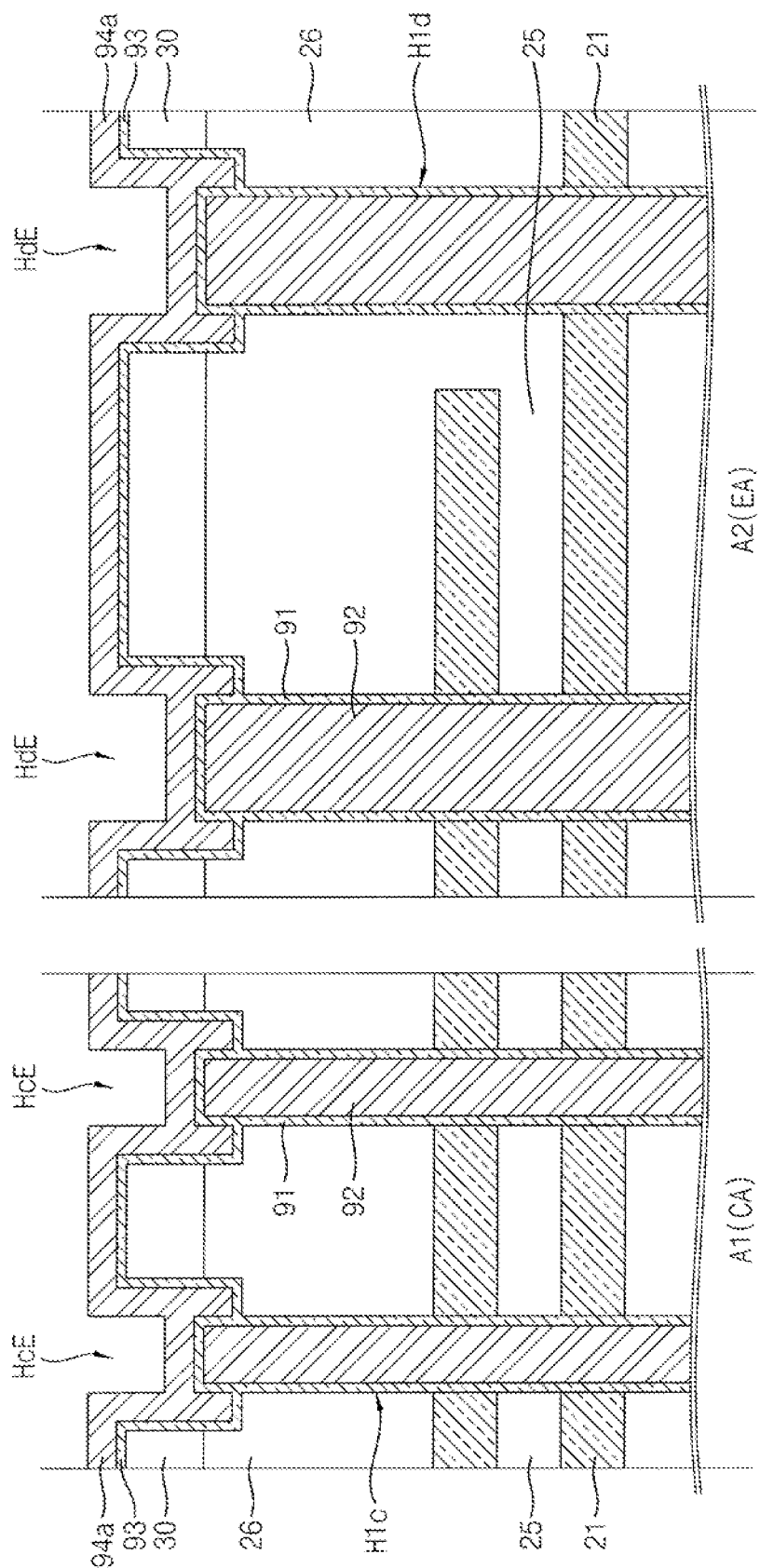

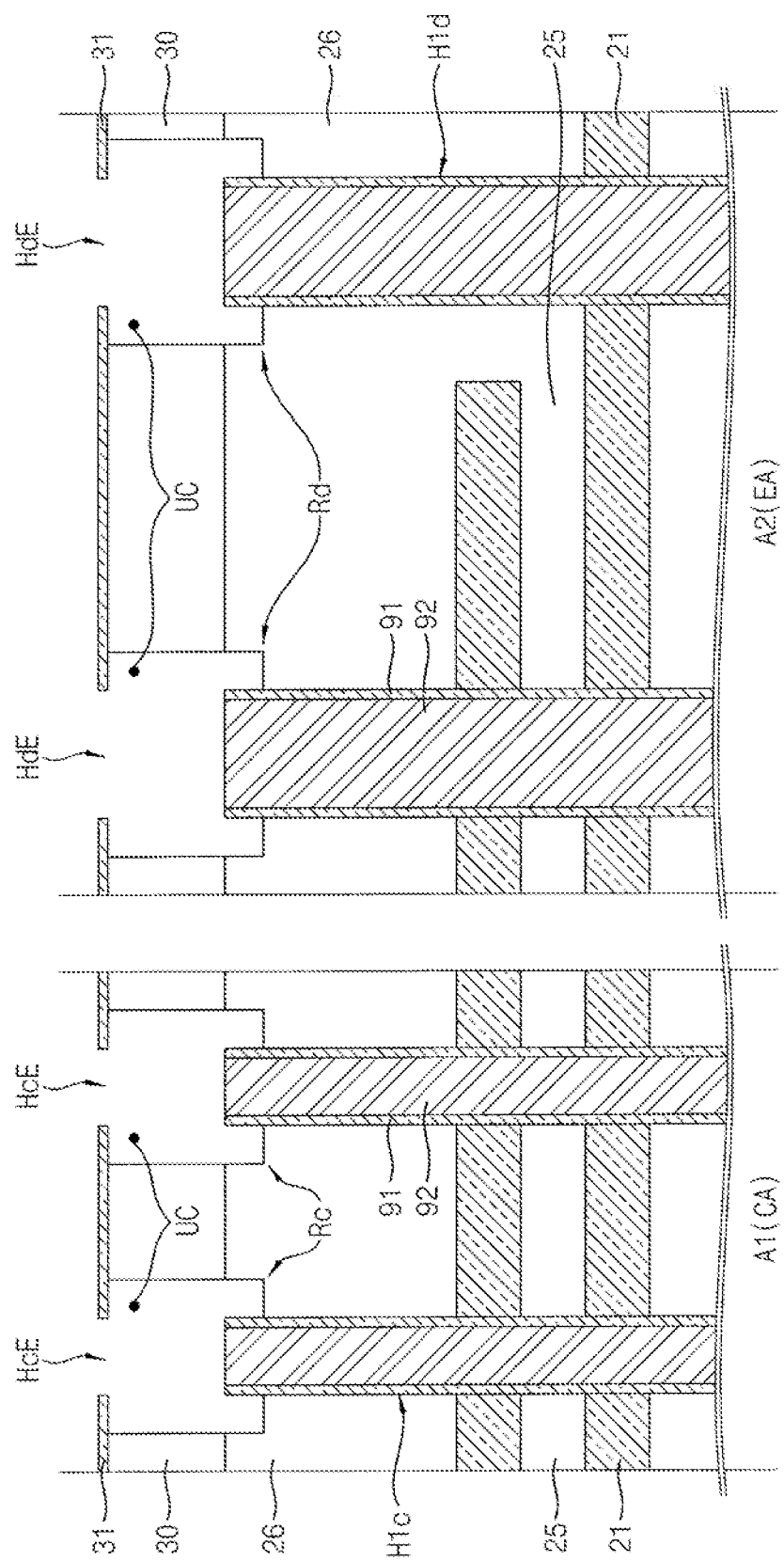

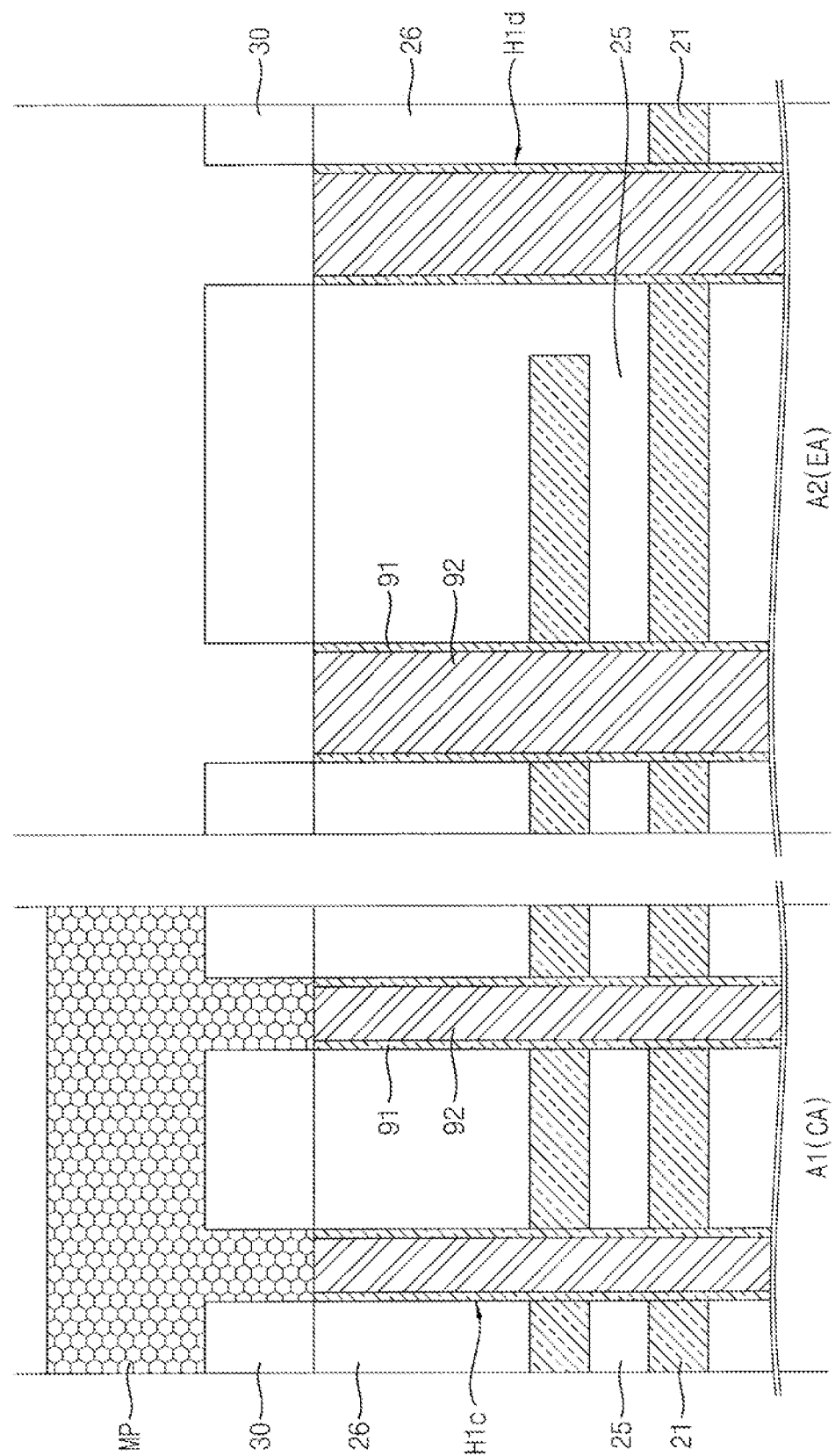

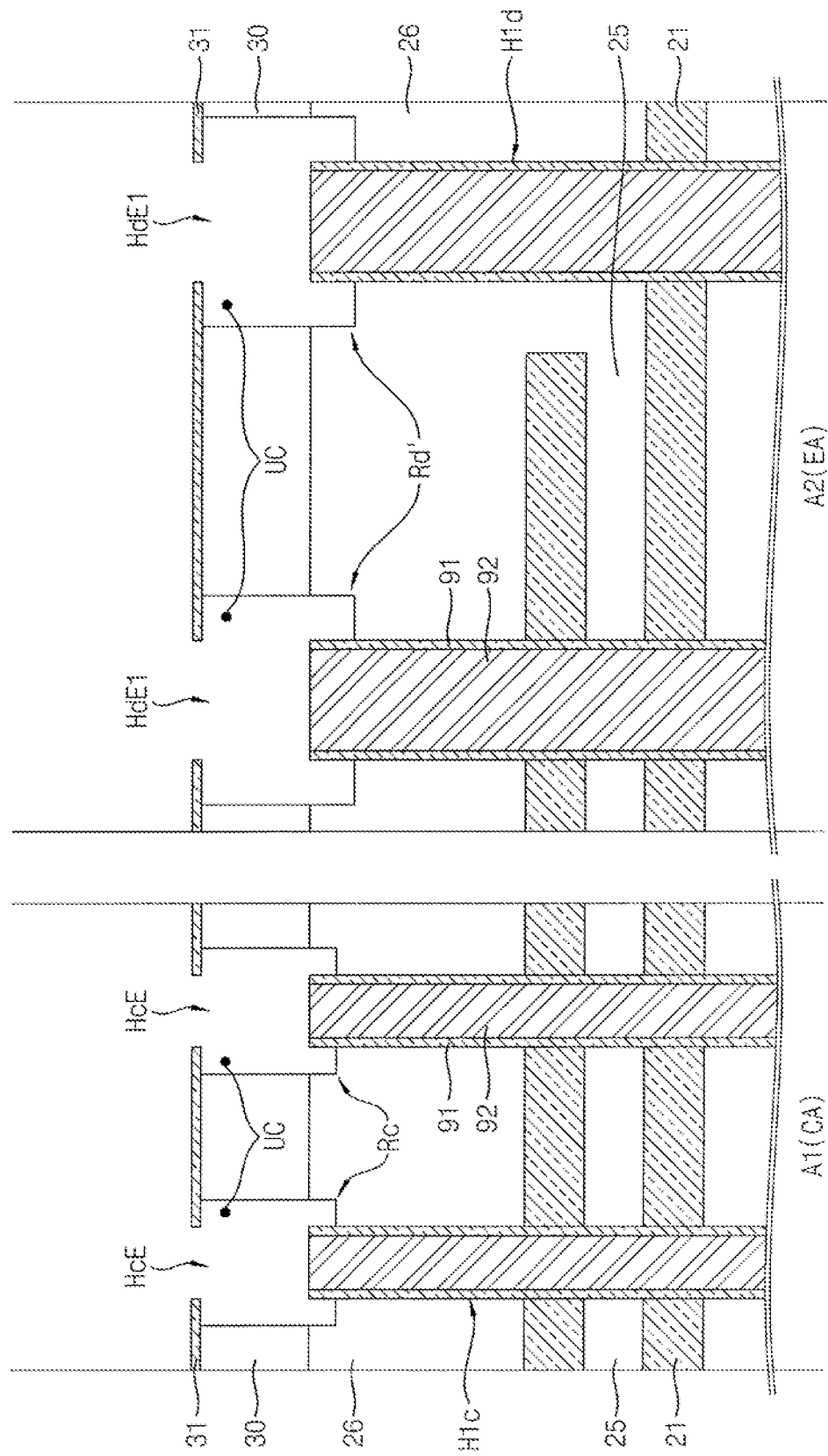

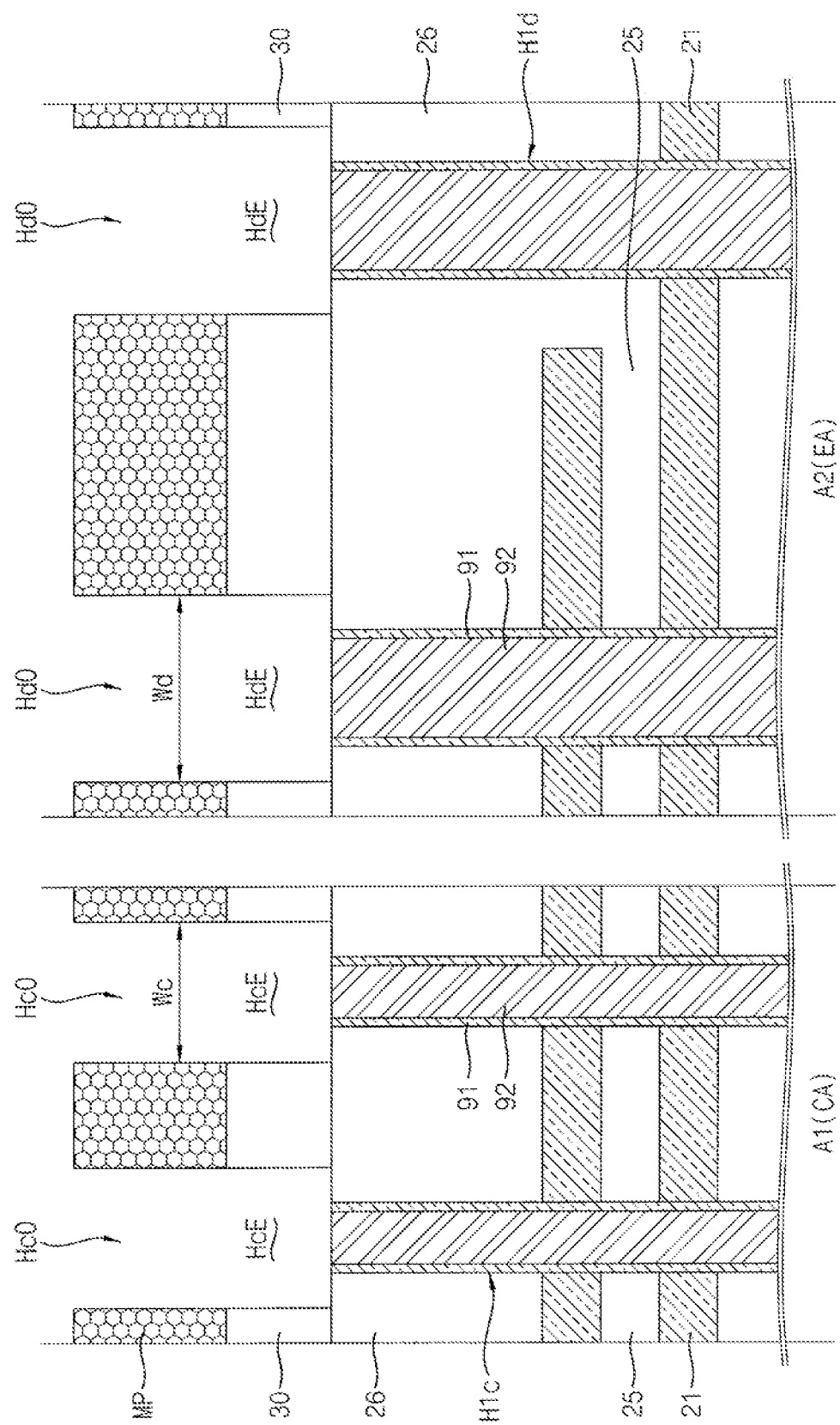

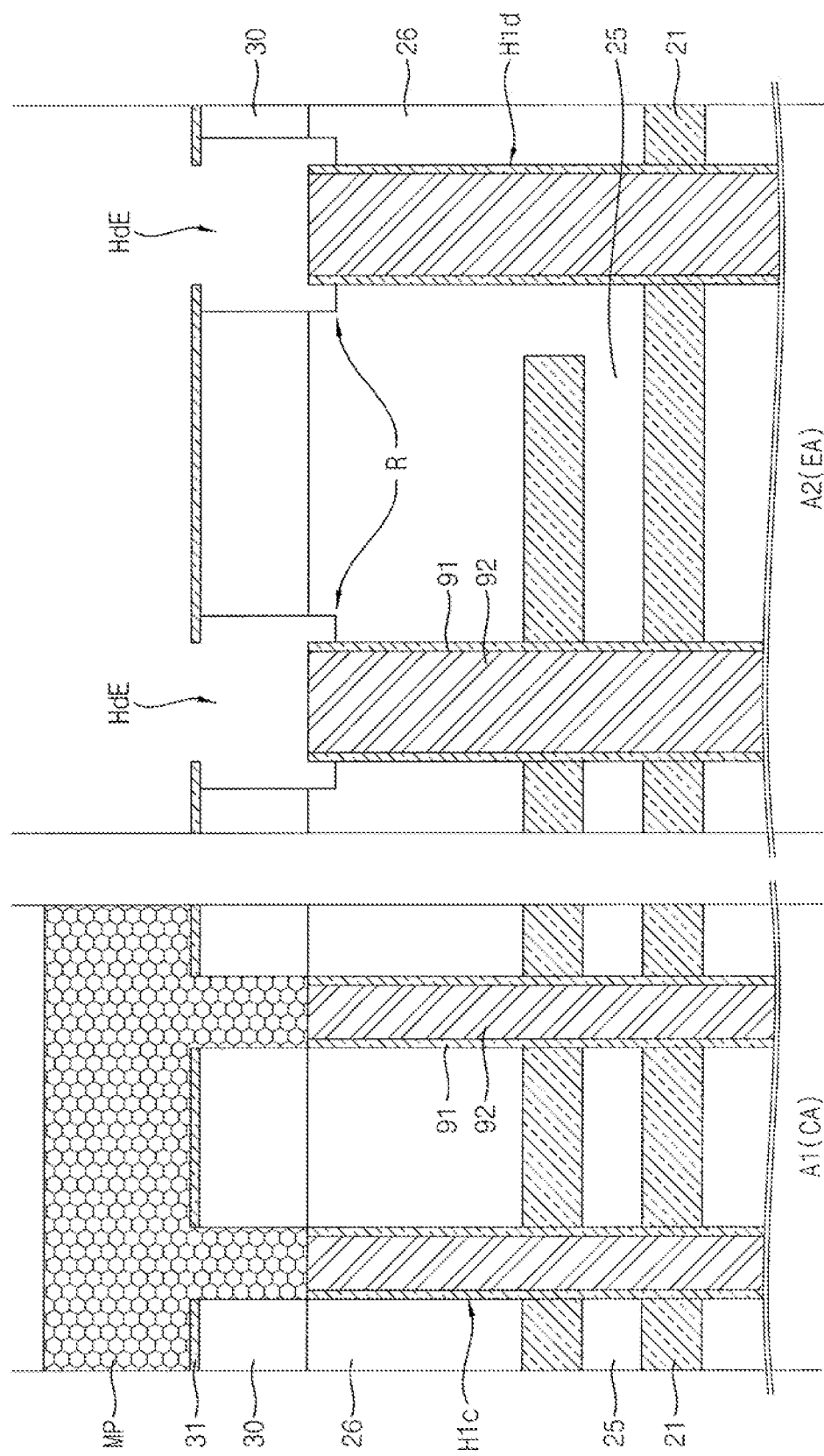

FIG. 11A
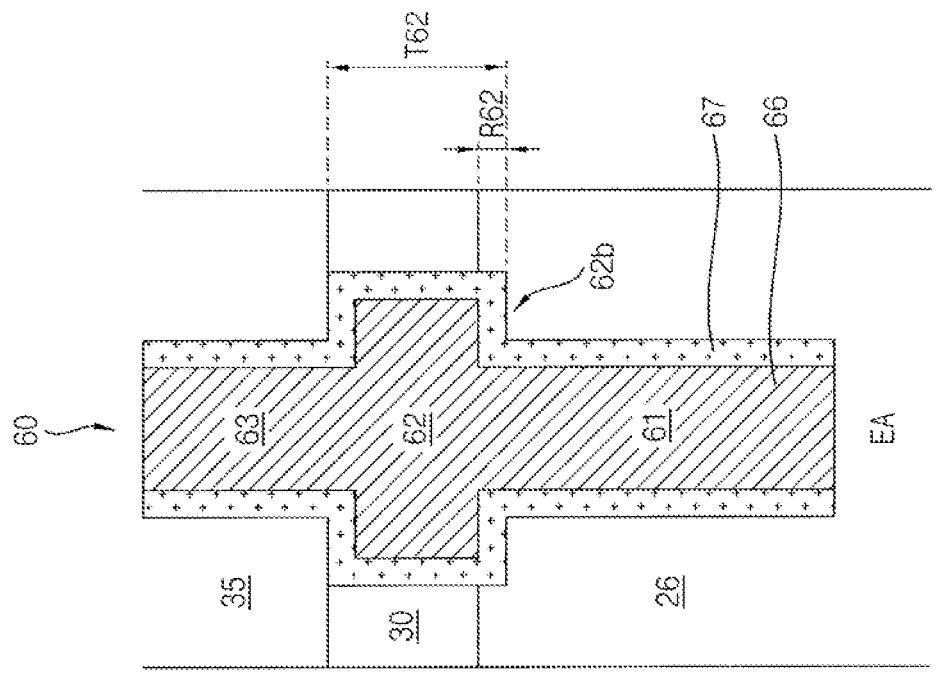
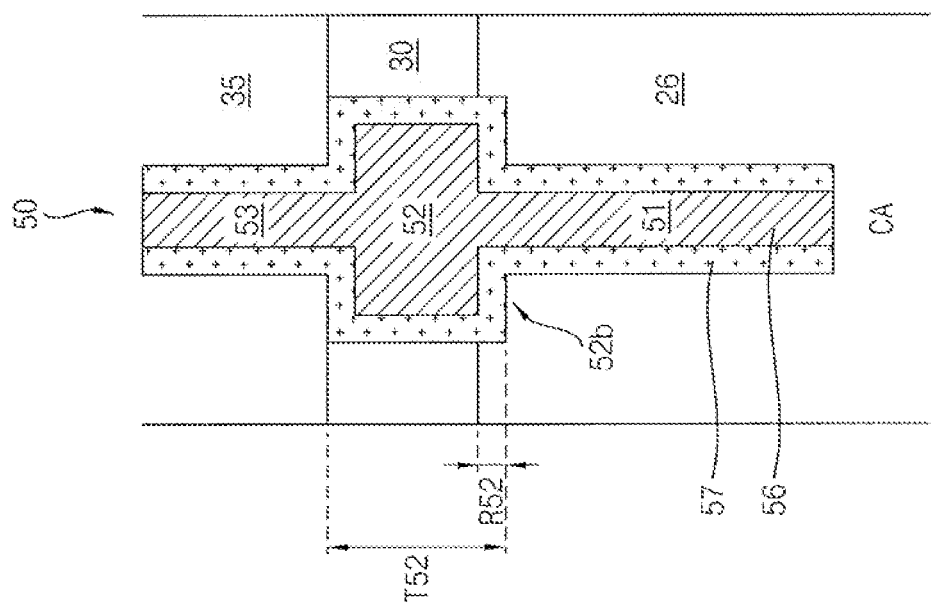

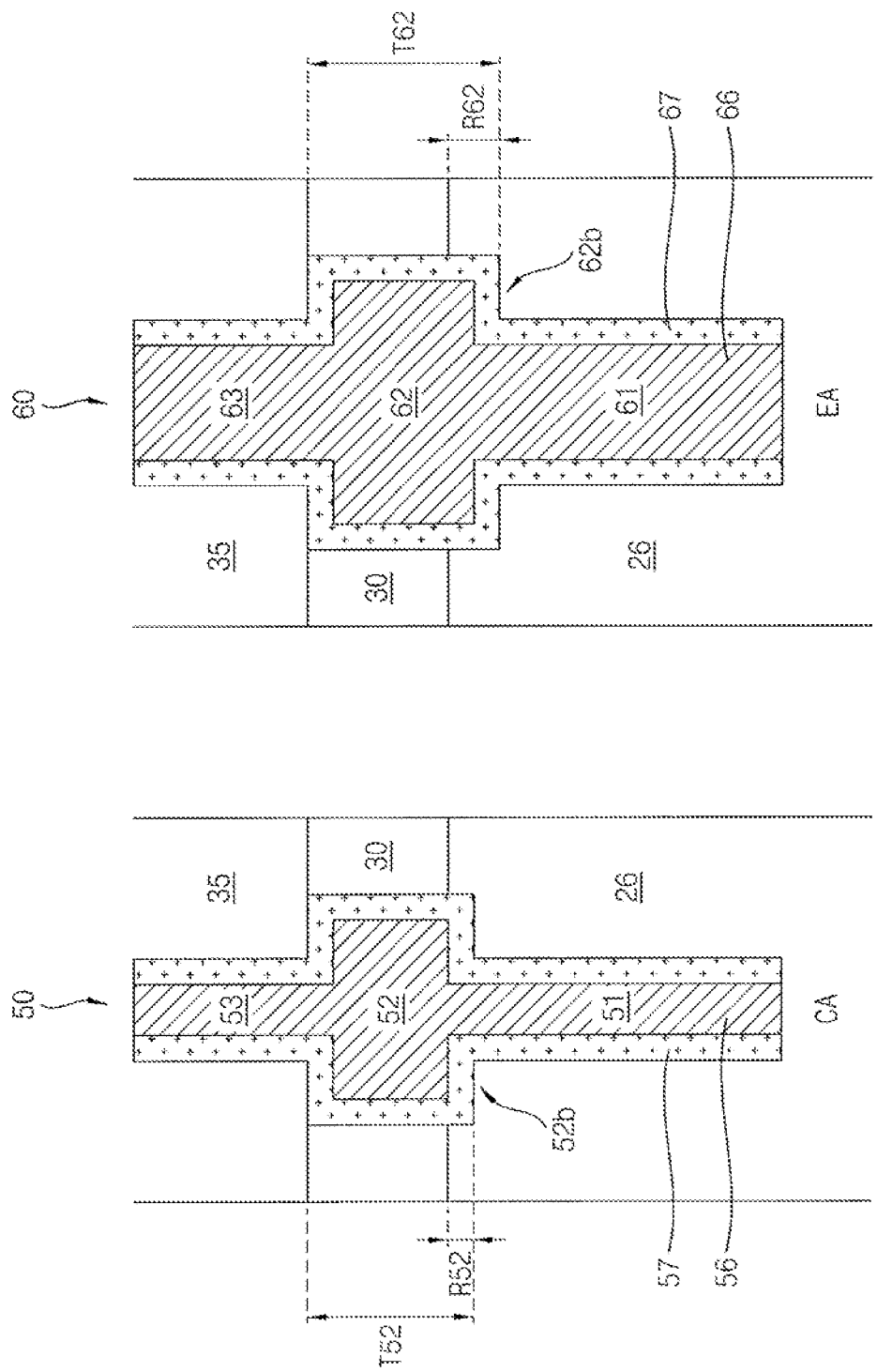

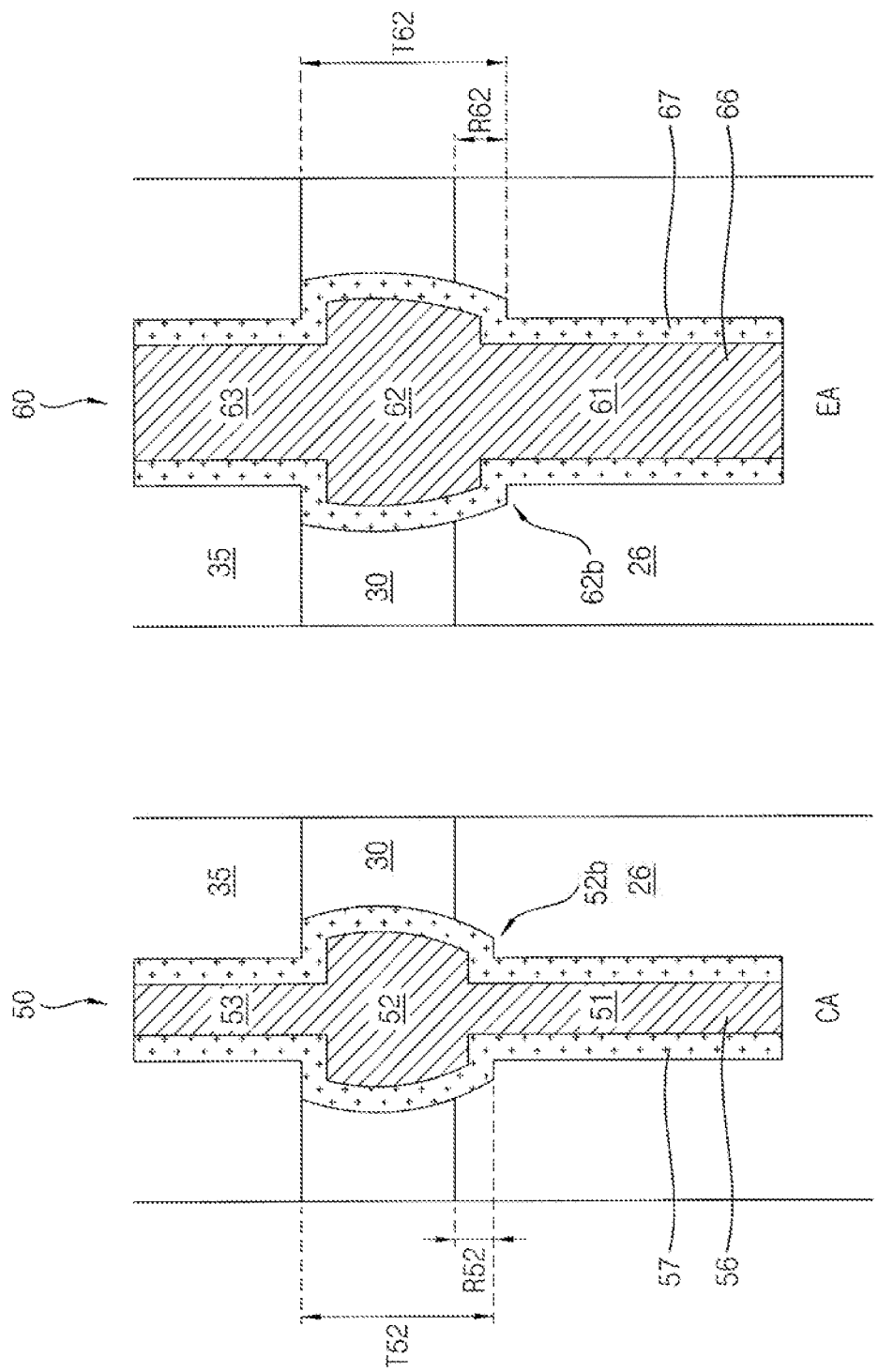

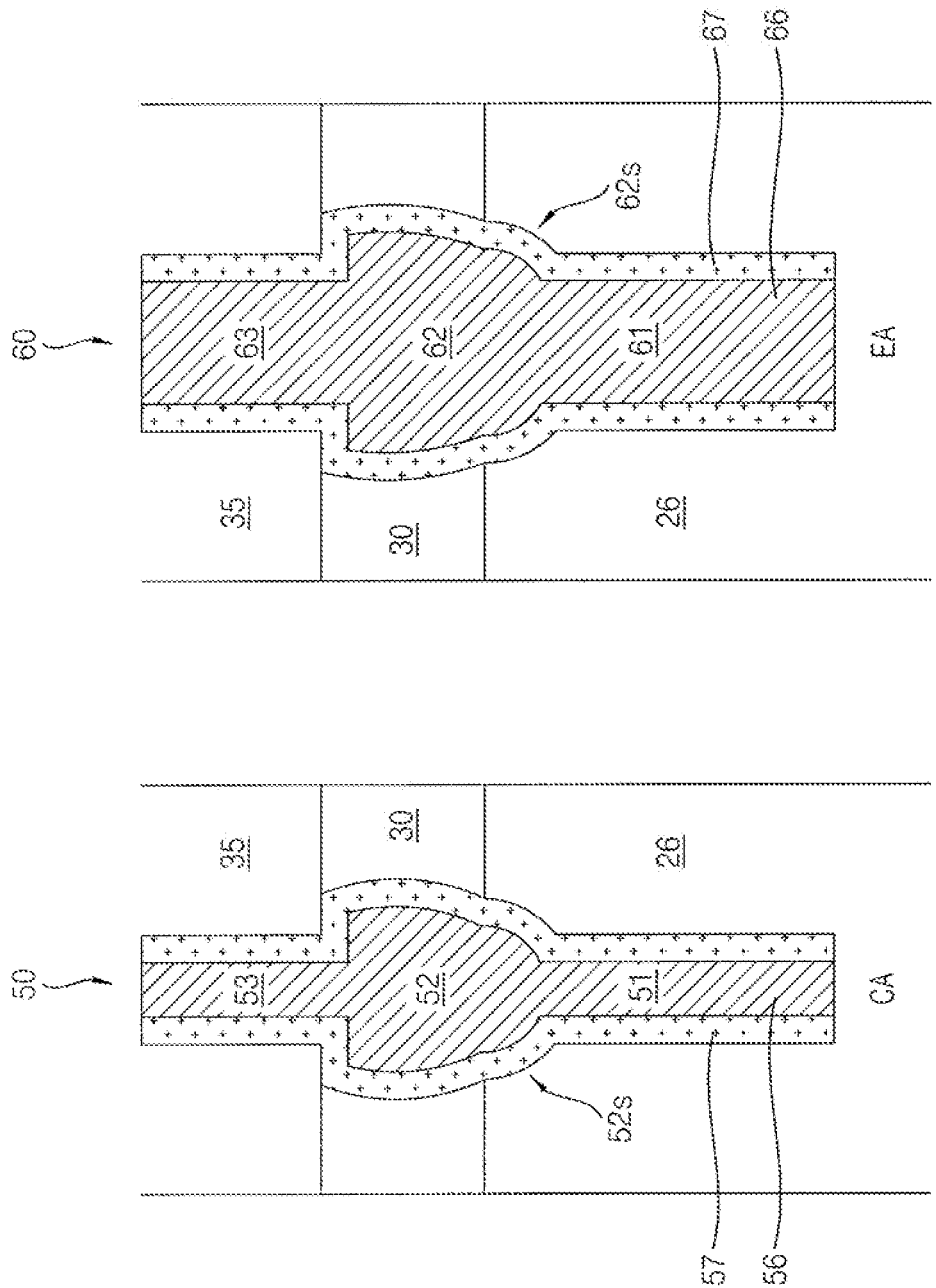

THREE-DIMENSIONAL FLASH MEMORY DEVICE INCLUDING CHANNEL STRUCTURES HAVING ENLARGED PORTIONS

CROSS-REFERENCE TO RELATED APPLICATIONS

This is a continuation application based on pending application Ser. No. 16/589,206, filed Oct. 1, 2019, the entire contents of which is hereby incorporated by reference.

Korean Patent Application No. 10-2019-0073628, filed on Jun. 20, 2019, in the Korean Intellectual Property Office, and entitled: "Three-Dimensional Flash Memory Device Including Channel Structures Having Enlarged Portions," is incorporated by reference herein in its entirety.

BACKGROUND

1. Field

Embodiments relate to a three-dimensional flash memory device including channel structures having enlarged portions.

2. Description of the Related Art

As the degree of integration of the three-dimensional flash memory device increases, a technique of forming one three-dimensional flash memory device by stacking two unit memory devices has been considered.

SUMMARY

The embodiments may be realized by providing a three-dimensional flash memory device having a cell area and an extension area, the device including a substrate; a lower word line stack and an upper word line stack on the substrate; an interlayer dielectric layer between the lower word line stack and the upper word line stack; a cell channel structure in the cell area; and a dummy channel structure in the extension area, wherein the cell channel structure includes a lower cell channel structure penetrating the lower word line stack and connected to the substrate; an upper cell channel structure penetrating the upper word line stack; and a cell channel enlarged portion between the lower cell channel structure and the upper dummy cell structure, the cell channel enlarged portion having a horizontal width that is greater than a horizontal width of the lower cell channel structure, wherein the dummy channel structure includes a lower dummy channel structure penetrating the lower word line stack and connected to the substrate; an upper dummy channel structure penetrating the upper word line stack; and a dummy channel enlarged portion between the lower dummy channel structure and the upper dummy channel structure, the dummy channel enlarged portion having a horizontal width that is greater than a horizontal width of the lower dummy channel structure, wherein a difference between the horizontal width of the dummy channel enlarged portion and the horizontal width of the lower dummy channel structure is greater than a difference between the horizontal width of the cell channel enlarged portion and the horizontal width of the lower cell channel structure.

The embodiments may be realized by providing a three-dimensional flash memory device having a cell area and an extension area, the device including a substrate; a lower word line stack and an upper word line stack on the substrate; an interlayer dielectric layer between the lower word line stack and the upper word line stack; a cell channel structure in the cell area; and a dummy channel structure in the extension area, wherein the cell channel structure includes a lower cell channel structure penetrating the lower word line stack and connected to the substrate; an upper cell channel structure penetrating the upper word line stack; and a cell channel enlarged portion between the lower cell channel structure and the upper cell channel structure, wherein the dummy channel structure includes a lower dummy channel structure penetrating the lower word line stack and connected to the substrate; an upper dummy channel structure penetrating the upper word line stack; and a dummy channel enlarged portion between the lower dummy channel structure and the upper dummy channel structure, wherein a bottom surface of the dummy channel enlarged portion is at a lower level than a bottom surface of the interlayer dielectric layer.

The embodiments may be realized by providing a three-dimensional flash memory device having a cell area and an extension area, the device including a substrate; a lower word line stack on the substrate and including a plurality of stacked lower word lines, an upper word line stack on the substrate and including a plurality of stacked upper word lines; an interlayer dielectric layer between the lower word line stack and the upper word line stack; a cell channel structure in the cell area; and a dummy channel structure and a vertical contact structure in the extension area, wherein the cell channel structure includes a lower cell channel structure penetrating the lower word line stack and connected to the substrate; an upper cell channel structure penetrating the upper word line stack; and a cell channel enlarged portion between the lower cell channel structure and the upper cell channel structure, the dummy channel structure includes a lower dummy channel structure penetrating the lower word line stack and connected to the substrate; an upper dummy channel structure penetrating the upper word line stack; and a dummy channel enlarged portion between the lower dummy channel structure and the upper dummy channel structure, the vertical contact structure is connected to one lower word line of the lower word line stack or one upper word line of the upper word line stack, a horizontal width of the lower dummy channel structure is greater than a horizontal width of the lower cell channel structure, a horizontal width of the dummy channel enlarged portion is greater than a horizontal width of the cell channel enlarged portion, a bottom surface of the dummy channel enlarged portion is at a lower level than a bottom surface of the interlayer dielectric layer, and side surfaces of the dummy channel enlarged portion and side surfaces of the cell channel enlarged portion are rounded.

BRIEF DESCRIPTION OF THE DRAWINGS

Features will be apparent to those of skill in the art by describing in detail exemplary embodiments with reference to the attached drawings in which:

FIG. 3B illustrates an enlarged view of a portion of FIG. 3A.

FIGS. 4A to 4M illustrate views of stages in a method of forming a three-dimensional flash memory device in accordance with an embodiment of the present disclosure, of which FIGS. 4B to 4H illustrate enlarged views of a region A1 and a region A2 of FIG. 4A.

FIGS. 5A to 5C illustrate views of stages in a method of forming a three-dimensional flash memory device in accordance with an embodiment of the present disclosure, of which FIGS. 5B and 5C illustrate enlarged views of the area A1 and the area A2 in FIG. 5A.

FIGS. 6A to 6C illustrate views of stages in a method of forming a three-dimensional flash memory device in accordance with an embodiment of the present disclosure.

FIGS. 7A and 7B illustrate views of stages in a method of forming a three-dimensional flash memory device in accordance with an embodiment of the present disclosure.

FIG. 8 illustrates a diagram of a stage in a method of forming a three-dimensional flash memory device in accordance with an embodiment of the present disclosure.

FIG. 10 illustrates a view of a stage in a method of forming a three-dimensional flash memory device in accordance with an embodiment of the present disclosure.

FIGS. 11A to 11C illustrate enlarged views of a portion of a cell channel structure 50 and a portion of a dummy channel structure 60 of a three-dimensional flash memory device in accordance with an embodiment of the present disclosure.

FIGS. 12A to 12D illustrate enlarged views of a portion of a cell channel structure 50 and a portion of a dummy channel structure 60 of a three-dimensional flash memory device in accordance with various embodiments of the present disclosure.

DETAILED DESCRIPTION

Figure 1A:
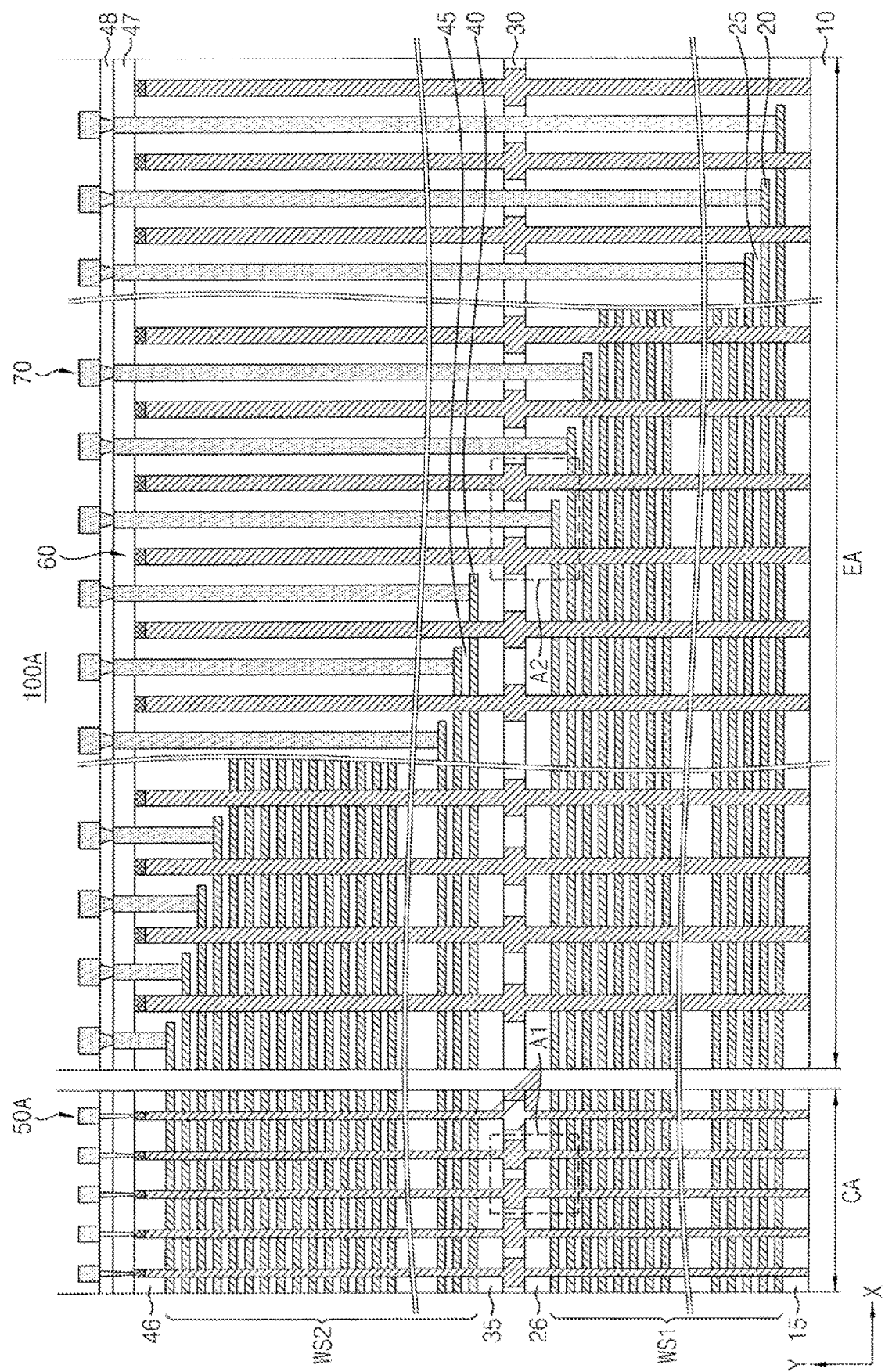
FIG. 1A illustrates a schematic cross-sectional view of a three-dimensional flash memory device 100A in accordance with an embodiment of the present disclosure.
Figure 1B:
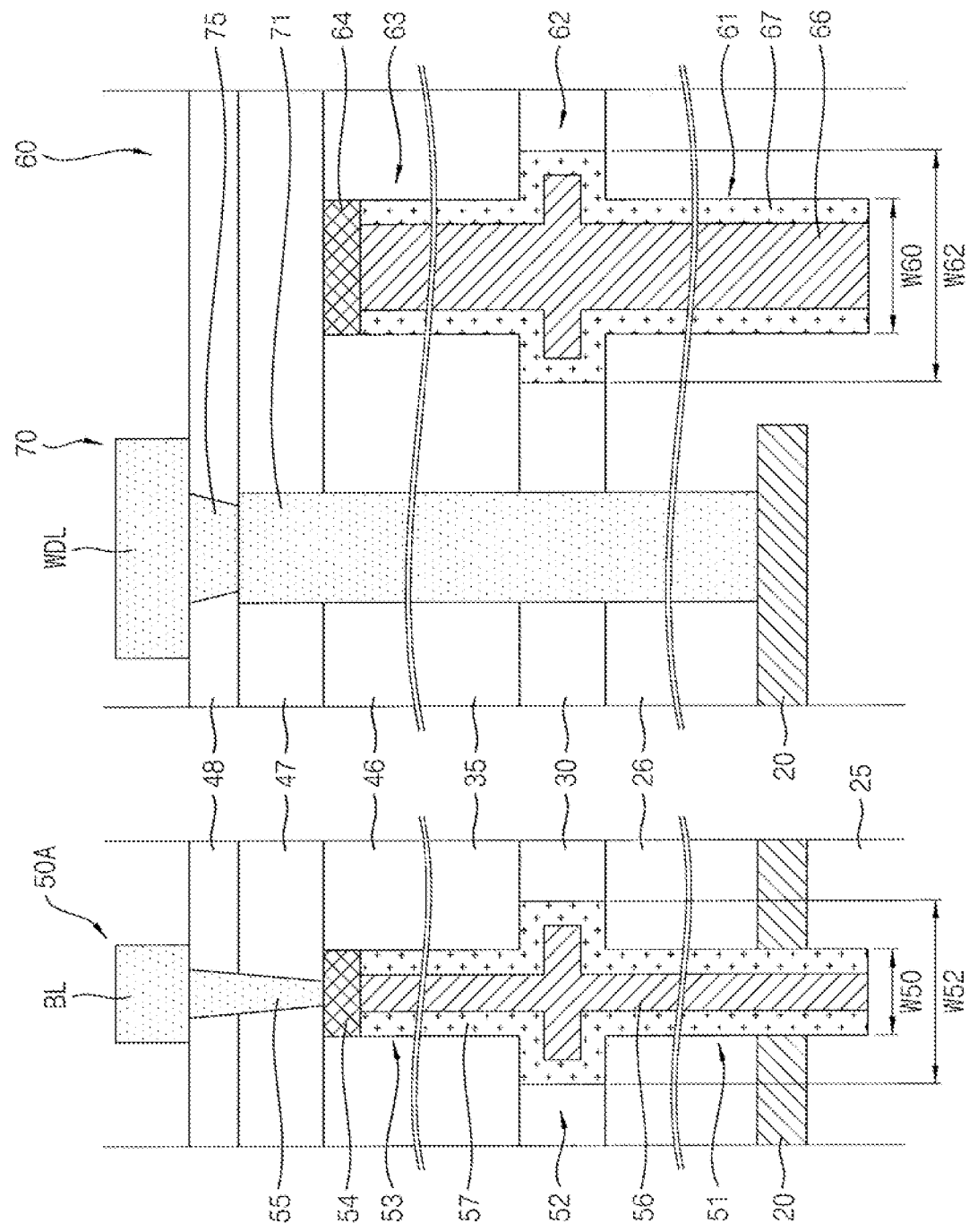
FIG. 1B illustrates an enlarged view of a portion of FIG. 1A.

FIG. 1A illustrates a schematic cross-sectional view of a three-dimensional flash memory device 100A in accordance with an embodiment of the present disclosure, and FIG. 1B illustrates an enlarged view of a portion of FIG. 1A.

Referring to FIGS. 1A and 1B, a three-dimensional flash memory device 100A in accordance with an embodiment of the present disclosure may include a pad insulating layer 15, a lower word line stack WS1, interlayer dielectric layers 26, 30, and 35, an upper word line stack WS2, and capping insulating layers 46, 47, and 48 stacked on a substrate 10. The three-dimensional flash memory device 100A may have a cell area CA and an extension area EA. The cell area CA may be an area including a plurality of memory cells and the extension area EA may be an area where the word line stacks WS1 and WS2 have a staircase structure. The three-dimensional flash memory device 100A may include a cell channel structure 50A vertically penetrating the pad insulating layer 15, the lower word line stack WS1, the interlayer dielectric layers 26, 30, and 35, the upper word line stack WS2, and the capping insulating layers 46, 47, and 48 and connected to the substrate 10 in the cell area CA. The three-dimensional flash memory device 100A may include a dummy channel structure 60 vertically penetrating the pad insulating layer 15, the lower word line stack WS1, the interlayer dielectric layers 26, 30 and 35, the upper word line stack WS2, and the capping insulating layers 46, 47, and 48 and connected to the substrate 10 (e.g., in the extension area EA). The three-dimensional flash memory device 100A may include a vertical contact structure 70 vertically penetrating the interlayer dielectric layers 26, 30, and 35, and the capping insulating layers 46, 47, and 48 to be connected to a portion of the lower word line stack WS1 and/or a portion of the upper word line stack WS2 (e.g., in the extension area EA).

The substrate 10 may include, e.g., a single crystalline silicon wafer, an epitaxially grown semiconducting layer, a silicon-on-insulator (SOI) substrate, or other semiconducting layers. As used herein, the term "or" is not an exclusive term, e.g., "A or B" includes A, B, or A and B.

The pad insulating layer 15 may be directly on the substrate 10. The pad insulating layer 15 may exhibit excellent adhesion to the substrate 10. The pad insulating layer 15 may have a coefficient of thermal expansion that is relatively similar to the substrate 10. The pad insulating layer 15 may include a relatively flexible material. For example, the pad insulating layer 15 may include a silicon oxide.

The lower word line stack WS1 may include alternately stacked multilayered lower word lines 20 and multilayered lower mold insulating layers 25. The upper word line stack WS2 may include alternately stacked multilayered upper word lines 40 and multilayered upper mold insulating layers 45. The lower word lines 20 and the upper word lines 40 may respectively include a conductor. The lower mold insulating layers 25 and the upper mold insulating layers 45 may respectively include an insulator such as silicon oxide.

The interlayer dielectric layers 26, 30, and 35 may include silicon oxide to electrically insulate and mechanically protect the lower word line stack WS1 and the upper word line stack WS2. The interlayer dielectric layers 26, 30, and 35 may include a lower interlayer dielectric layer 26, the middle interlayer dielectric layer 30, and an upper interlayer dielectric layer 35. The lower interlayer dielectric layer 26 may cover the lower word line stack WS1, and may surround an upper portion of the lower cell channel structure 51 (e.g., a portion of the lower cell channel structure 51 that is distal to the substrate 10 relative to a second direction Y) and an upper portion of the lower dummy channel structure 61. The upper interlayer dielectric layer 35 may be below the upper word line stack WS2 (e.g., between the upper word line stack WS2 and the substrate 10 in the second direction Y) to surround a lower portion of the upper cell channel structure 53 and a lower portion of the upper dummy channel structure 63. The middle interlayer dielectric layer 30 may be between the lower interlayer dielectric layer 26 and the upper interlayer dielectric layer 35 (e.g., in the second direction Y), and may surround side surfaces of a cell channel enlarged portion 52 and side surfaces of a dummy channel enlarged portion 62. The middle interlayer dielectric layer 30 may have a density or a hardness that is different from those of the lower interlayer dielectric layer 26 and/or the upper interlayer dielectric layer 35. In an implementation, the middle interlayer dielectric layer 30 may be softer than the lower interlayer dielectric layer 26 and the upper interlayer dielectric layer 35. For example, the middle interlayer dielectric layer 30 may include an insulating material that is formed at a lower temperature than the lower interlayer dielectric layer 26 and the upper interlayer dielectric layer 35. In an implementation, the middle interlayer dielectric layer 30 may be denser than the lower interlayer dielectric layer 26 and the upper interlayer dielectric layer 35. For example, the middle interlayer dielectric layer 30 may include an insulating material that is formed at a higher temperature than the lower interlayer dielectric layer 26 and the upper interlayer dielectric layer 35. For example, the middle interlayer dielectric layer 30 may have an etch selectivity with respect the lower interlayer dielectric layer 26.

The capping insulating layers 46, 47, and 48 may include silicon oxide to electrically insulate and mechanically protect the upper word line stack WS2. The capping insulating layers 46, 47, and 48 may include a lower capping insulating layer 46, a middle capping insulating layer 47, and an upper capping insulating layer 48. The lower capping insulating layer 46 may cover the upper word line stack WS2, and may surround an upper portion of the upper cell channel structure 53 and an upper portion of the upper dummy channel structures 63. The middle capping insulating layer 47 may surround a lower portion of a cell via plug 55 and an upper portion of a lower contact plug 71 of the vertical contact structure 70. The upper capping insulating layer 48 may surround an upper portion of the cell via plug 55 and an upper contact plug 75 of the vertical contact structure 70.

In the cell area CA, the multilayered word lines 20 and 40 may be horizontally formed in parallel with each other (e.g., may extend in a first direction X) to form a plurality of memory cells together with the cell channel structure 50A, respectively.

In the extension area EA, the multilayered word lines 20 and 40 may be arranged in a staircase structure, and the multilayered word lines 20 and 40 may be electrically and mechanically connected to the vertical contact structures 80, respectively. For example, in the extension area EA, the multilayered word lines 20 and 40 may have a shorter horizontal length (e.g., in the first direction X) at higher levels (e.g., distal to or farther from the substrate 10 in the second direction Y) and a longer horizontal length at lower levels (e.g., proximate or closer to the substrate 10 in the second direction Y).

In the cell area CA, the pad insulating layer 15, the lower mold insulating layer 25, and the lower interlayer dielectric layer 26 may be integrated (e.g., as a monolithic, one-piece unit), and the upper interlayer dielectric layer 35, the upper mold insulating layer 45, and the lower capping insulating layer 46 may be integrated. In an implementation, the middle interlayer dielectric layer 30 may be integrated with the lower interlayer dielectric layer 26 and/or the upper interlayer dielectric layer 35. In an implementation, the lower capping insulating layer 46, the middle capping insulating layer 47, and the upper capping insulating layer 48 may be integrated. For example, the pad insulating layer 15, the lower mold insulating layer 25, the lower interlayer dielectric layer 26, the upper interlayer dielectric layer 35, the upper mold insulating layer 45, the lower capping insulating layer 46, the middle capping insulating layer 47, and the upper capping insulating layer 48 may all include silicon oxide.

The cell channel structure 50A may include a lower cell channel structure 51, a cell channel enlarged portion 52, and an upper cell channel structure 53.

The lower cell channel structure 51 may vertically (e.g., in the second direction Y) penetrate the pad insulation layer 15, the lower word line stack WS1, and the lower interlayer insulation layer 26 to electrically and physically connect to the substrate 10 and the cell channel enlarged portion 52. The upper cell channel structure 53 may be electrically and physically connected to the cell channel enlarged portion 52 and may vertically penetrate the upper capping insulating layer 46, the upper word line stack WS2, and the upper interlayer dielectric layer 35. The cell channel enlarged portion 52 may be between the lower cell channel structure 51 and the upper cell channel structure 53. A horizontal width W52 (e.g., measured in the first direction X) of the cell channel enlarged portion 52 may be wider than a horizontal width W50 of the lower cell channel structure 51 and/or the upper cell channel structure 53. For example, the cell channel enlarged portions 52 may have a horizontally enlarged bottom surface (e.g., substrate-facing surface) and a horizontally enlarged upper surface (e.g., surface that faces away from the substrate 10). In an implementation, the cell channel enlarged portion 52 may have, e.g., a flange shape, a disk shape, or a nail head shape. In an implementation, the cell channel enlarged portion 52 and the lower cell channel structure 51 may have a round nail head shape.

The cell channel structure 50A may further include a cell via pad 54 and a cell via plug 55 on the upper cell channel structure 51. The cell channel structure 50A may be electrically connected to the bit line BL through the cell via pad 54 and the cell via plug 55. The via pad 54 may include, e.g., a doped polysilicon, a metal silicide, a metal barrier material, or a metal. Upper surfaces of the cell via pad 54 and the lower capping insulating layer 46 may be co-planar. The via plugs 55 may vertically penetrate the middle capping insulating layer 47 and the upper capping insulating layer 48 to electrically and physically connect to the cell via pad 54 and the bit line BL. The via plug 55 may include, e.g., a metal silicide, a metal barrier material, a metal, or a metallic conductive material. The bit line BL may include, e.g., a metal, and may extend in the horizontal direction (e.g., the first direction X).

The cell channel structure 50A may include a cell gap-fill core 56 and a cell memory layer 57. The cell gap-fill core 56 may have a pillar shape, and may include an insulator such as silicon oxide. The cell memory layer 57 may have a cylindrical shape surrounding the cell gap-fill core 56, and may include multilayered material layers. For example, the cell memory layer 57 may include a charge trap layer, a tunneling insulating layer, and a channel layer. The lower cell channel structure 51, the cell channel enlarged portion 52, and the upper cell channel structure 53 may be physically and electrically connected with each other. For example, the cell gap-fill core 56 and the cell memory layer 57 may be integrated to be materially continued in the lower cell channel structure 51, the cell channel enlarged portion 52, and the upper cell channel structure 53.

The dummy channel structure 60 may include a lower dummy channel structure 61, a dummy channel enlarged portion 62, and an upper dummy channel structure 63. The lower dummy channel structure 61 may vertically penetrate the pad insulating layer 15, the lower word line stack WS1, and the lower interlayer dielectric layer 26 to be electrically and physically connected to the substrate 10 and the dummy channel enlarged portion 62. The upper dummy channel structure 63 may vertically penetrate the upper capping insulating layer 46, the upper word line stack WS2, and the upper interlayer dielectric layer 35 to be electrically and physically connected to the dummy channel enlarged portion 62. The dummy channel enlarged portion 62 may be between the lower dummy channel structure 61 and the upper dummy channel structure 63. A horizontal width W62 of the dummy channel enlarged portion 62 may be greater than a horizontal width W60 of the lower dummy channel structure 61 and/or the upper dummy channel structure 63.

The dummy channel structure 60 may further include a dummy via pad 64 on the upper dummy channel structure 63. The dummy channel structure 60 may not be electrically connected to the bit line BL. For example, elements corresponding to the cell via plug 55 of the cell channel structure 50A may be omitted (e.g., not formed). The dummy via pad 64 may include, e.g., doped polysilicon, a metal silicide, a metal barrier material, a metal, or a metallic conductive material. For example, the dummy via pad 64 may include the same material as the cell via pad 54. Upper surfaces of the dummy via pad 64 and the lower capping insulating layer 46 may be also co-planar.

The dummy channel structure 60 may include a dummy gap-fill core 66 and a dummy memory layer 67. The dummy gap-fill core 66 may have a pillar shape, and may include an insulating material such as silicon oxide. The dummy memory layer 67 may have a cylindrical shape surrounding the dummy gap-fill core 66, and may include multilayered material layers. For example, the dummy memory layer 67 may include a dummy charge trap layer, a dummy tunneling insulating layer, and a dummy channel layer. The lower dummy channel structure 61, the dummy channel enlarged portion 62, and the upper dummy channel structure 63 may be physically and electrically connected with each other. For example, the dummy gap-fill core 66 and the dummy memory layer 67 may be integrated to be materially continued in the lower dummy channel structure 61, the dummy channel enlarged portion 62, and the upper dummy channel structure 63.

The dummy channel structure 60 may be greater (e.g., larger) than the cell channel structure 50A. For example, the horizontal width W60 of the lower dummy channel structure 61 and/or the upper dummy channel structure 63 of the dummy channel structure 60 may be greater than the horizontal width W50 of the lower cell channel structure 51 and/or the upper cell channel structure 53 of the cell channel structure 50A. The horizontal width W62 of the dummy channel enlarged portion 62 of the dummy channel structure 60 may be greater than the horizontal width W52 of the cell channel enlarged portion 52 of the cell channel structure 50A. In an implementation, a difference (W62-W60) between the horizontal width W62 of the dummy channel enlarged portion 62 and the horizontal width W60 of the lower dummy channel structure 61 may be substantially equal to or similar to a difference (W52-W50) between the horizontal width W52 of the cell channel enlarged portion 52 and the horizontal width W50 of the lower cell channel structure 51.

The vertical contact structures 70 may be between the dummy channel structures 60. Each of the vertical contact structures 70 may include a lower contact plug 71 and an upper contact plug 75. The lower contact plugs 71 may partially or fully vertically penetrate the interlayer dielectric layers 26, 30, and 35 and the capping insulating layers 46 and 47 to be electrically and physically connected to one of the lower word lines 20 of the lower word line stack WS1 or one of the upper word lines 40 of the upper word line stack WS2. For example, lower ends of the lower contact plugs 71 may be exclusively connected to an end of one of the lower word lines 20 or one of the upper word lines 40 in the extension area EA, respectively. For example, the lower contact plugs 71 of the vertical contact structures 70 may have a shape of staircase railing pillars that do not vertically penetrate the lower word line stack WS1 and the upper word line stack WS2. The upper contact plugs 75 may penetrate the upper capping insulating layer 48 to be electrically and physically connect the lower contact plugs 71 to the word line drive lines WDL, respectively. For example, the lower contact plugs 71 and the upper contact plugs 75 may include a metal and/or a metal compound.

Figure 2A:
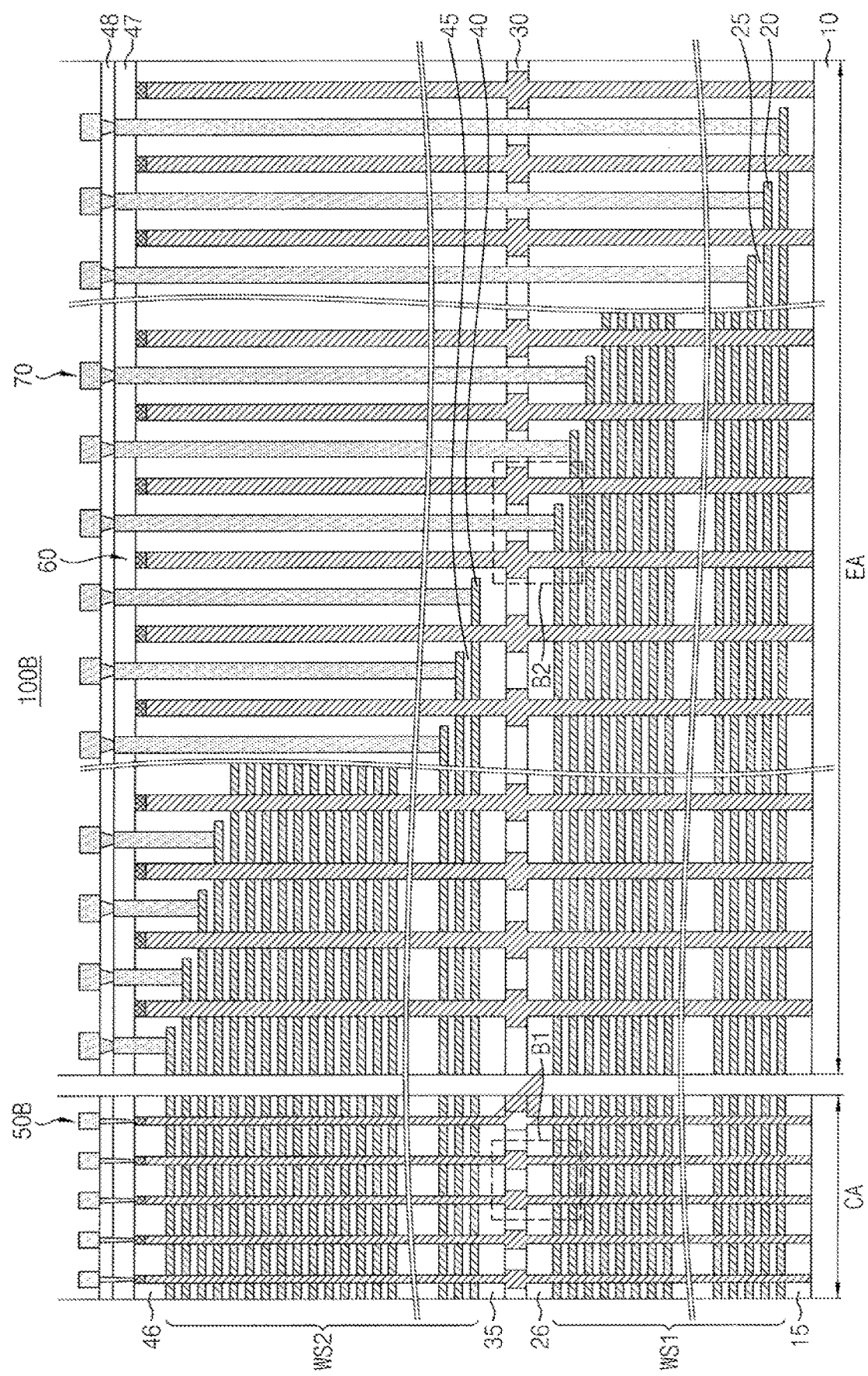
FIG. 2A illustrates a schematic cross-sectional view of a three-dimensional flash memory device 100B in accordance with an embodiment of the present disclosure.
Figure 2B:
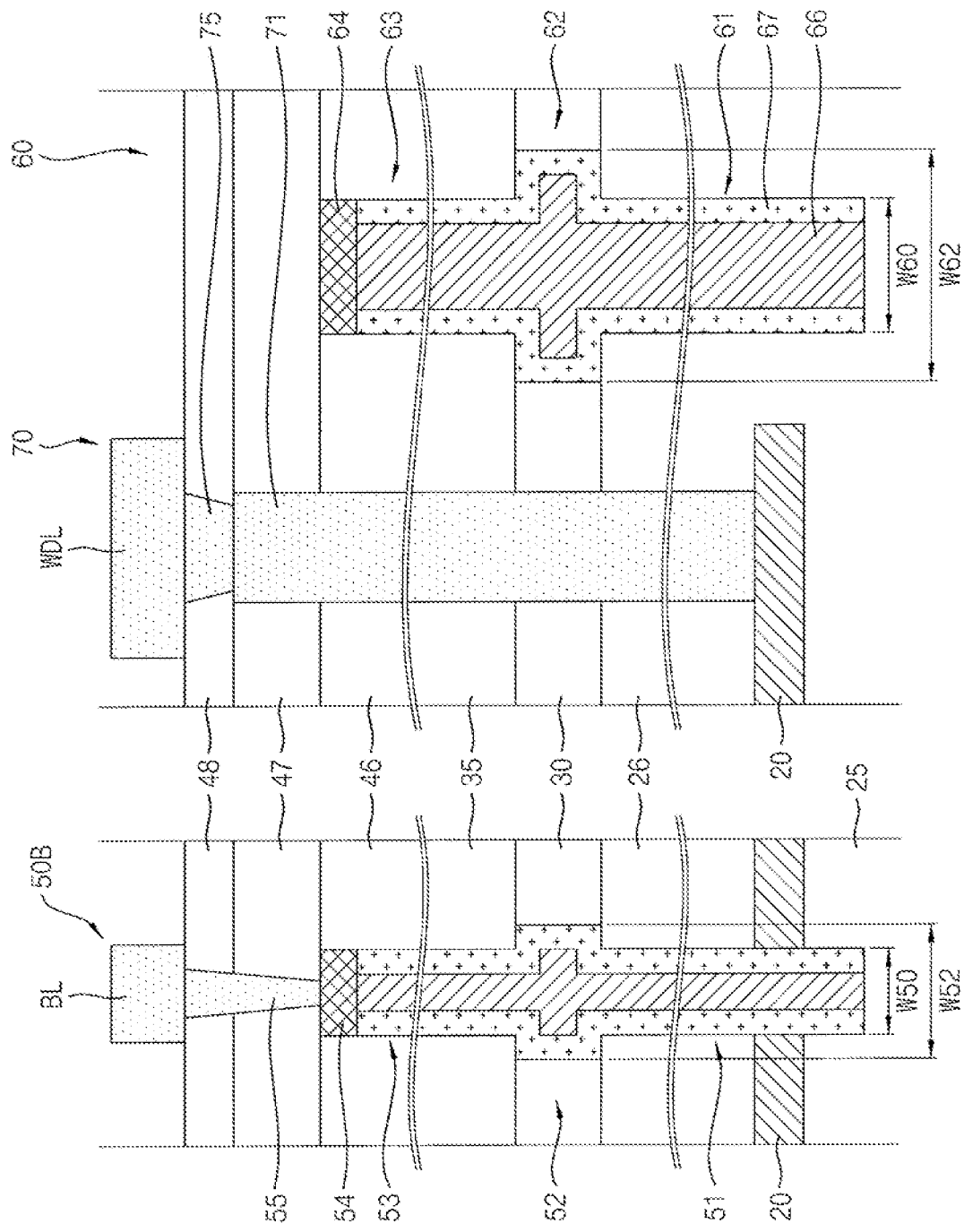
FIG. 2B illustrates an enlarged view of a portion of FIG. 2A.

FIG. 2A illustrates a schematic cross-sectional view of a three-dimensional flash memory device 100B in accordance with an embodiment of the present disclosure, and FIG. 2B illustrates an enlarged view of a portion of FIG. 2A.

Referring to FIGS. 2A and 2B, a three-dimensional flash memory device 100B may include a cell channel structure 50B vertically penetrating a pad insulating layer 15, a lower word line stack WS1, interlayer dielectric layers 26, 30, and 35, an upper word line stack WS2, and capping insulating layers 46, 47, and 48 to be connected with a substrate 10 in a cell area CA, and a dummy channel structure 60 vertically penetrating the lower word line stack WS1, the interlayer dielectric layers 26, 30, and 35, the upper word line stack WS2, and the capping insulating layers 46, 47, and 48 in an extension area EA. Other elements not described may be understood with reference to FIGS. 1A and 1B.

In an implementation, the difference (W62-W60) between the horizontal width W62 of the dummy channel enlarged portion 62 and the horizontal width W60 of the lower dummy channel structure 61 may be greater than the difference (W52-W50) between the horizontal width W52 of the cell channel enlarged portion 52 and the horizontal width W50 of the lower cell channel structure 51. For example, the dummy channel enlarged portion 62 may be enlarged more horizontally than the cell channel enlarged portions 52 (e.g., the dummy channel enlarged portion 62 may protrude in the first direction X from the lower dummy channel structure 61 by a distance that is greater than a distance that the cell channel enlarged portion 52 protrudes in the first direction X from the lower cell channel structure 51).

Figure 3A:
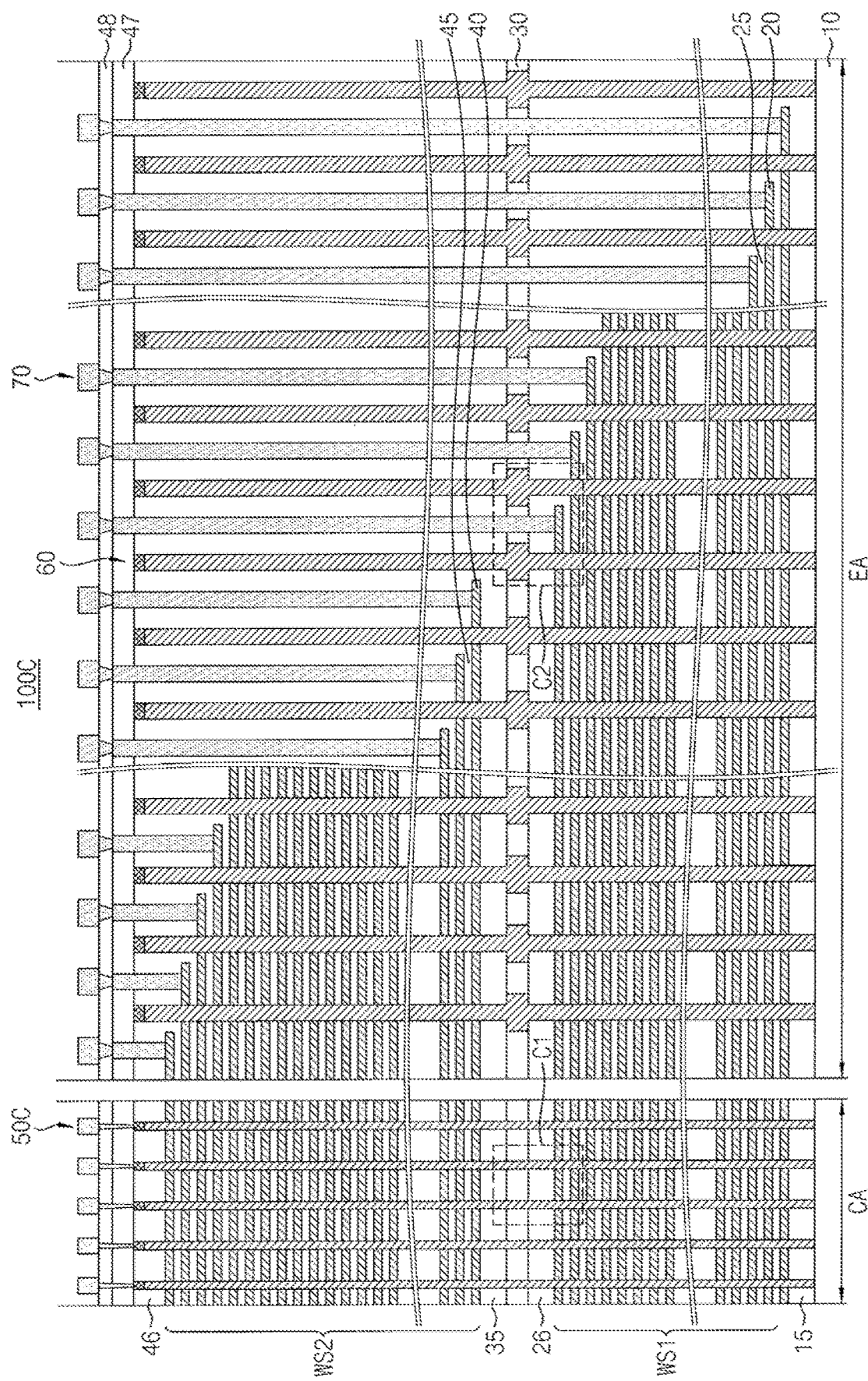
FIG. 3A illustrates a schematic cross-sectional view of a three-dimensional flash memory device 100C in accordance with an embodiment of the present disclosure.

FIG. 3A illustrates a schematic cross-sectional view of a three-dimensional flash memory device 100C in accordance with an embodiment of the present disclosure, and FIG. 3B illustrates an enlarged view of a portion of FIG. 3A.

Referring to FIGS. 3A and 3B, a three-dimensional flash memory device 100C may include a cell channel structure 50C vertically penetrating a pad insulating layer 15, a lower word line stack WS1, interlayer dielectric layers 26, 30, and 35, an upper word line stack WS2, and capping insulating layers 46, 47, and 48 to be connected to a substrate 10 in a cell area CA, and a dummy channel structure 60 vertically penetrating the pad insulating layer 15, the lower word line stack WS1, the interlayer dielectric layers 26, 30, and 35, the upper word line stack WS2, and the capping insulating layers 46, 47, and 48 to be connected to the substrate 10 in an extension area EA. Other elements not described may be understood with reference to FIGS. 1A and 1B.

The cell channel structure 50C may include a lower cell channel structure 51 and an upper cell channel structure 53 which may be directly connected with each other. For example, the cell channel structure 50C may not include the cell channel enlarged portion 52 shown in FIGS. 1A to 2B.

Figure 4A:
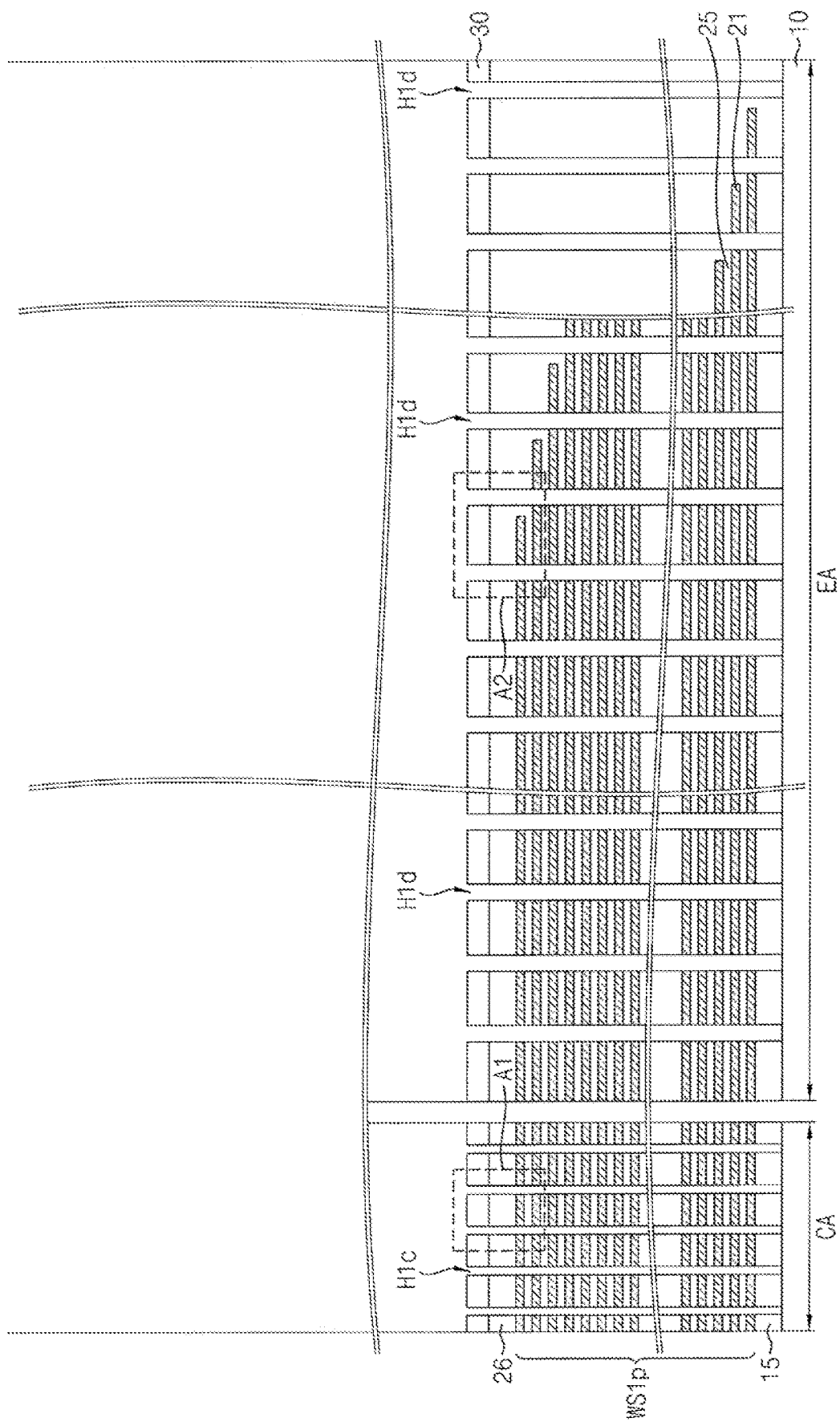

FIGS. 4A to 4M illustrate views of stages in a method of forming a three-dimensional flash memory device in accordance with an embodiment of the present disclosure, of which FIGS. 4B to 4H are enlarged views of a region A1 and a region A2 of FIG. 4A.

Referring to FIG. 4A, the method may include forming a pad insulating layer 15, a preliminary lower word line stack WS1p, a lower interlayer dielectric layer 26, and a middle interlayer dielectric layer 30 on a substrate 10 (having a cell area CA and an extension area EA that will define the cell area CA and extension area EA of the finally prepared device), and forming a lower cell channel hole H1c and a lower dummy channel hole H1d.

The forming of the pad insulating layer 15 may include performing a deposition process to form an insulating layer such as silicon oxide on the substrate 10.

The forming of the preliminary lower word line stack WS1p may include performing deposition processes to alternately stack a plurality of lower sacrificial insulation layers 21 and a plurality of lower mold insulation layers 25, and performing a staircase forming process to form ends of the lower sacrificial insulating layers 21 into a staircase shape in the extension area EA. The lower sacrificial insulating layers 21 and the lower mold insulating layers 25 may have etch selectivity. For example, the lower sacrificial insulating layers 21 may include silicon nitride and the lower mold insulating layers 25 may include silicon oxide.

The forming of the lower interlayer dielectric layer 26 and the middle interlayer dielectric layer 30 may include performing deposition processes to form insulating layers covering the preliminary lower word line stack WS1p. For example, the lower interlayer dielectric layer 26 and the middle interlayer dielectric layer 30 may include silicon oxide. The pad insulating layer 15, the lower mold insulating layers 25, the lower interlayer dielectric layer 26, and the middle interlayer dielectric layer 30 may include the same material. For example, the pad insulating layer 15, the lower mold insulating layers 25, the lower interlayer dielectric layer 26, and the middle interlayer dielectric layer 30 may be integrated to be materially continuous with each other in the extension area EA.

The forming of the lower cell channel holes Hic and the lower dummy channel holes H1d may include performing a photolithography process and an etching process to vertically penetrate the pad insulating layer 15, the preliminary lower word line stacks WS1p, the lower interlayer dielectric layer 26, and the interlayer dielectric layer 30 to expose a surface of the substrate 10.

Figure 4B:
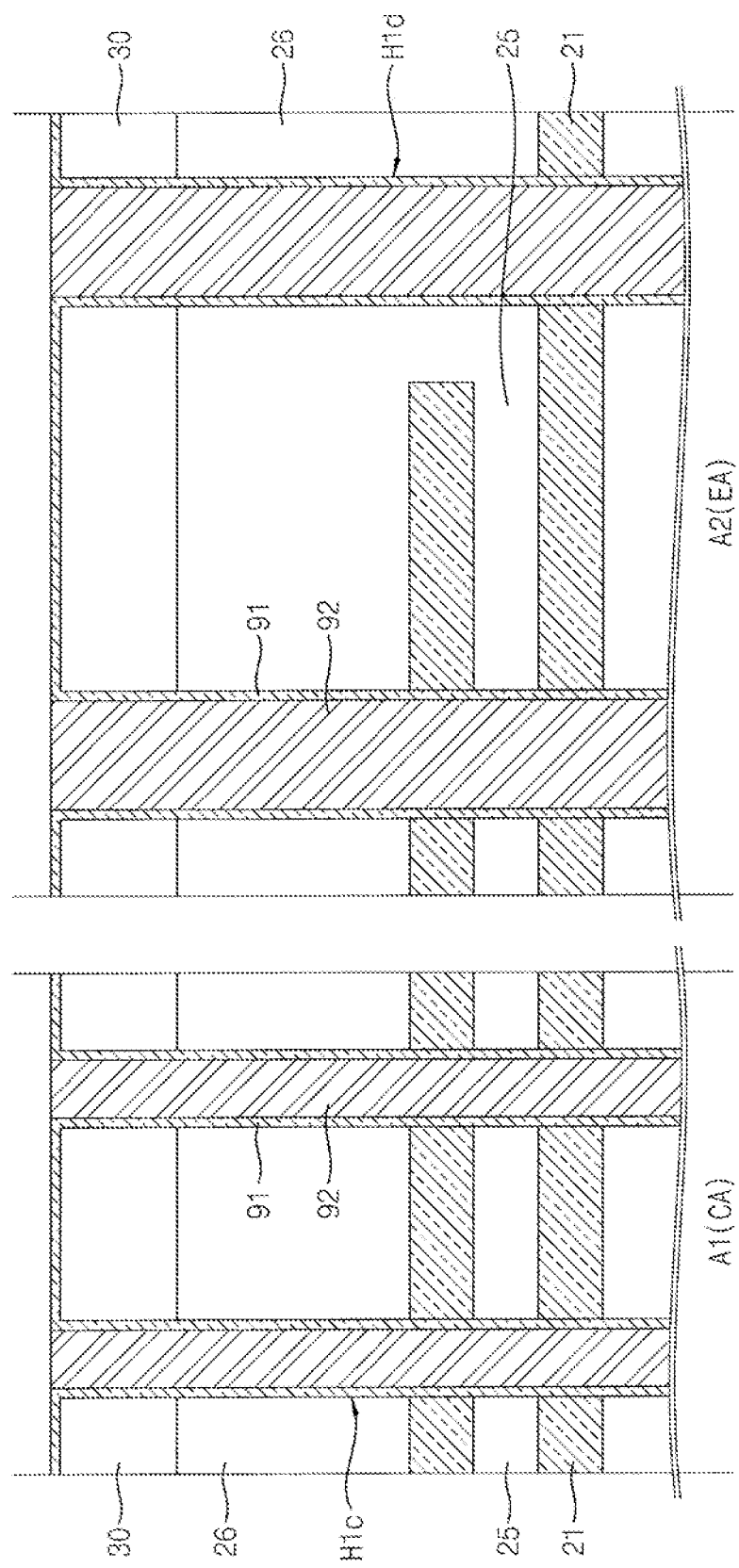

Referring to FIG. 4B, the method may include performing a deposition process, e.g., an atomic layer deposition (ALD) process, to conformably form a first sacrificial liner 91 on inner walls of the lower cell channel hole Hic and the lower dummy channel hole H1d, and forming a first sacrificial gap-filler 92 in the lower cell channel hole Hic and the lower dummy channel hole H1d. The first sacrificial liner 91 and the first sacrificial gap-filler 92 may include a material having an etch selectivity with respect to the middle interlayer dielectric layer 30. For example, the first sacrificial liner 91 may include silicon nitride, and the first sacrificial gap-filler 92 may include polysilicon.

The method may include performing a chemical mechanical polishing (CMP) process to planarize upper surfaces of the first sacrificial liner 91 and the first sacrificial gap-filler 92 to be co-planar. In an implementation, the first sacrificial liner 91 on the interlayer dielectric layer 30 may be removed so that an upper surface of the interlayer dielectric layer 30 may be exposed.

Figure 4C:
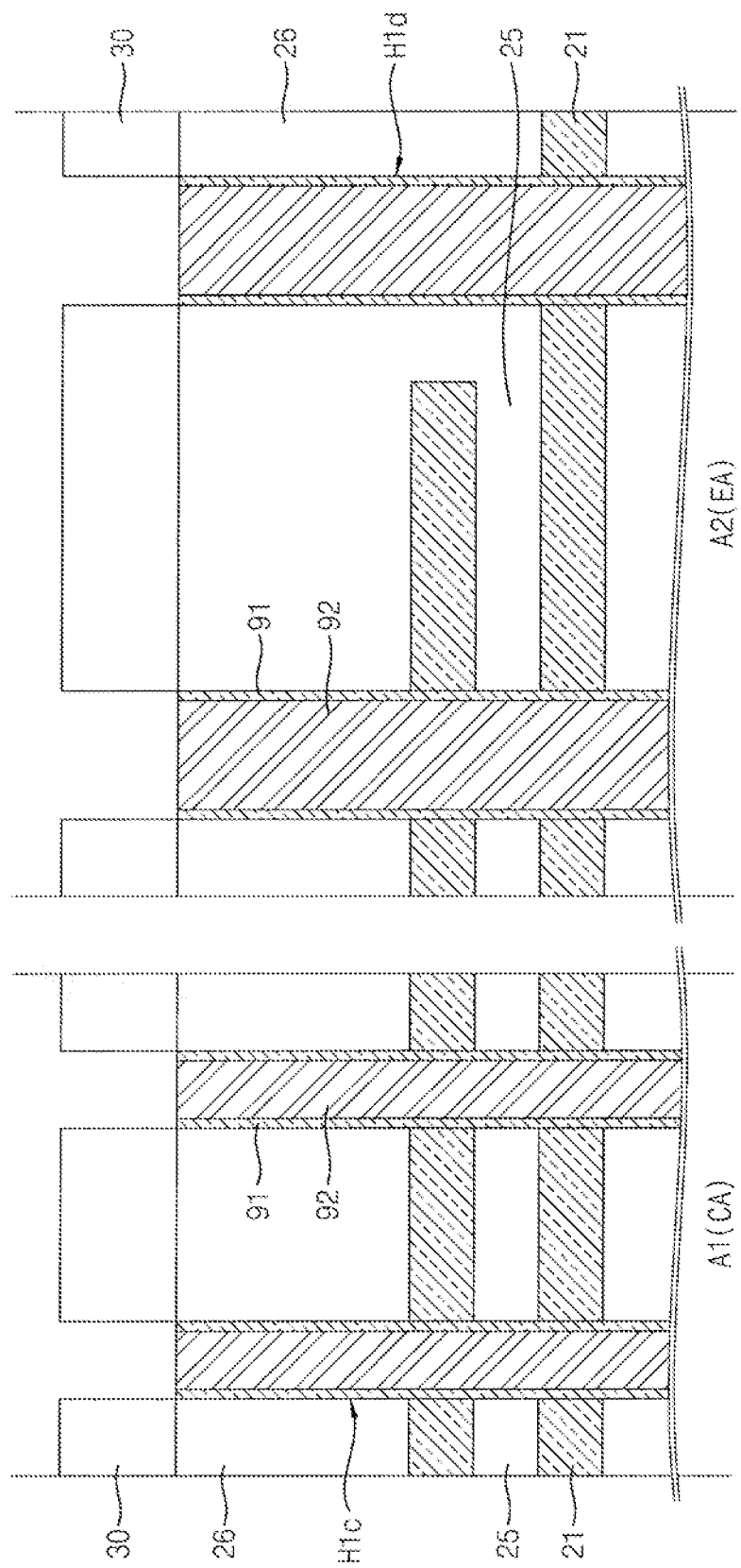

Referring to FIG. 4C, the method may include performing a recess process, e.g., a wet etch process, to partially remove upper portions of the first sacrificial liner 91 and the first sacrificial gap-filler 92. The process for removing the upper portion of the first sacrificial liner 91 and the process for removing the upper portion of the first sacrificial gap-filler 92 may be performed independently or respectively. For example, after a first removal process for removing the upper portion of the first sacrificial gap-filler 92 is performed, a second removal process for removing the upper portion of the first sacrificial liner 91 may be performed. In an implementation, the upper portion of the first sacrificial liner 91 and the upper portion of the first sacrificial gap-filler 92 may be at different levels (e.g., different distances from the substrate 10 in the second direction Y) from each other. In an implementation, the upper portion of the first sacrificial liner 91 and the upper portion of the first sacrificial gap-filler 92 may be at the same level, e.g., as illustrated in the drawing figures, to facilitate understanding of the technical idea of the present disclosure. In an implementation, the upper portion of the first sacrificial liner 91 and the upper portion of the first sacrificial gap-filler 92 may be at the same level as an interface between the lower interlayer dielectric layer 26 and the middle interlayer dielectric layer 30.

Figure 4D:
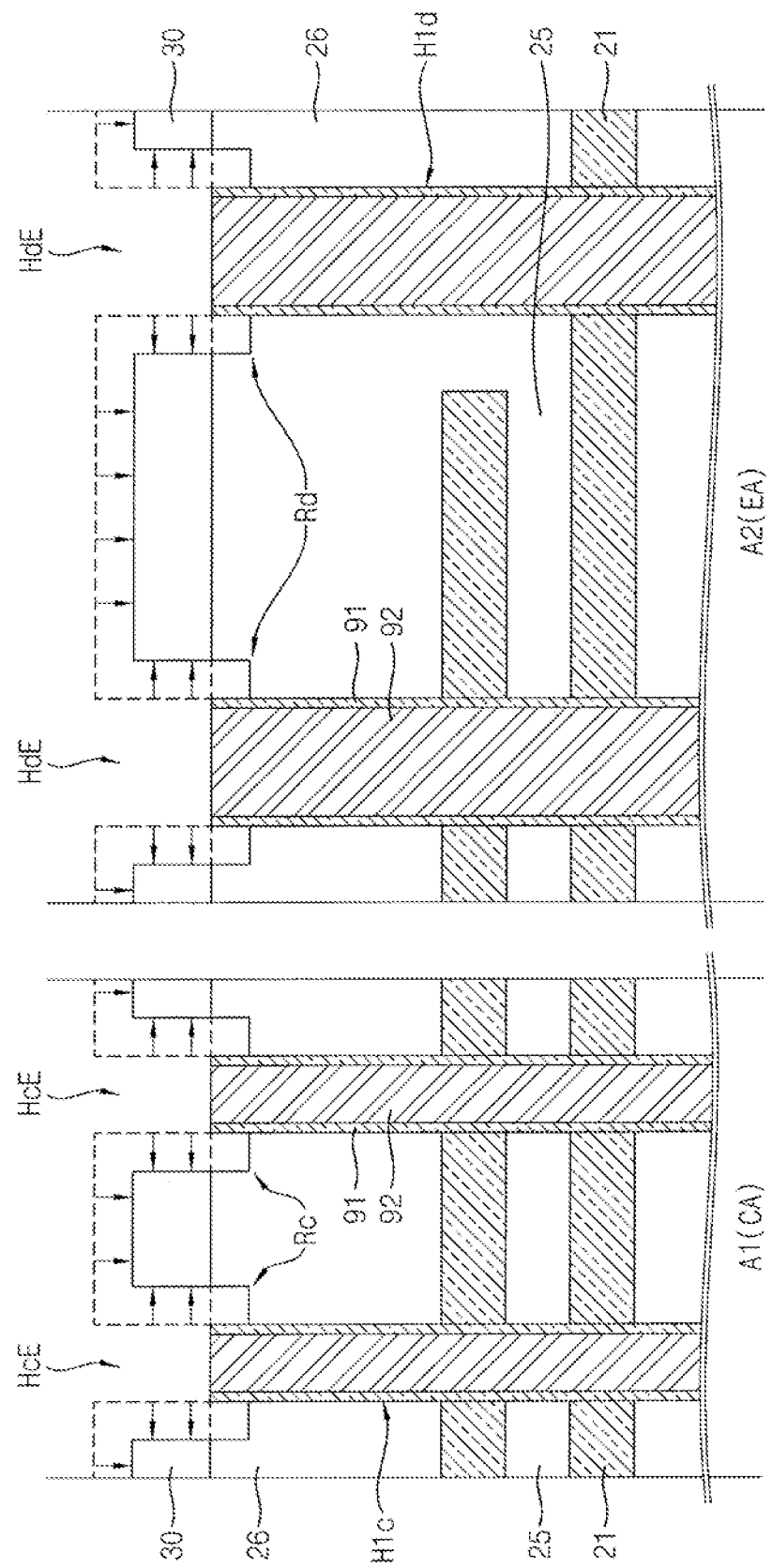

Referring to FIG. 4D, the method may include forming a cell channel enlarged portion HcE and a dummy channel hole enlarged portion HdE by partially removing surface (e.g., outer) portions of the middle interlayer dielectric layer 30 using an isotropic etching to enlarge the upper portions of the lower cell channel hole Hic and the lower dummy channel hole H1d. During the processes, the lower interlayer dielectric layer 26 may be partially removed. For example, the cell channel hole enlarged portion HcE and the dummy channel hole enlarged portion HdE may have recess portions Rc and Rd, respectively. In an implementation, depths of the recessed portions Rc and Rd (e.g., in the second direction Y) may be similar to or substantially the same with each other. In a top or plan view, the recessed portions Rc and Rd may have a ring shape or a disk shape.

Referring to FIG. 4E, the method may include conformably forming a second sacrificial liner 93 in the cell channel hole enlarged portion HcE and the dummy channel hole enlarged portion HdE, and then forming a spacer material layer 94a. The second sacrificial liner 93 may include a material that is the same as the first sacrificial liner 91. For example, the second sacrificial liner 93 may include silicon nitride. The spacer material layer 94a may have an etch selectivity with respect to the second sacrificial liner 93. For example, the spacer material layer 94a may include polycrystalline silicon.

Figure 4F:
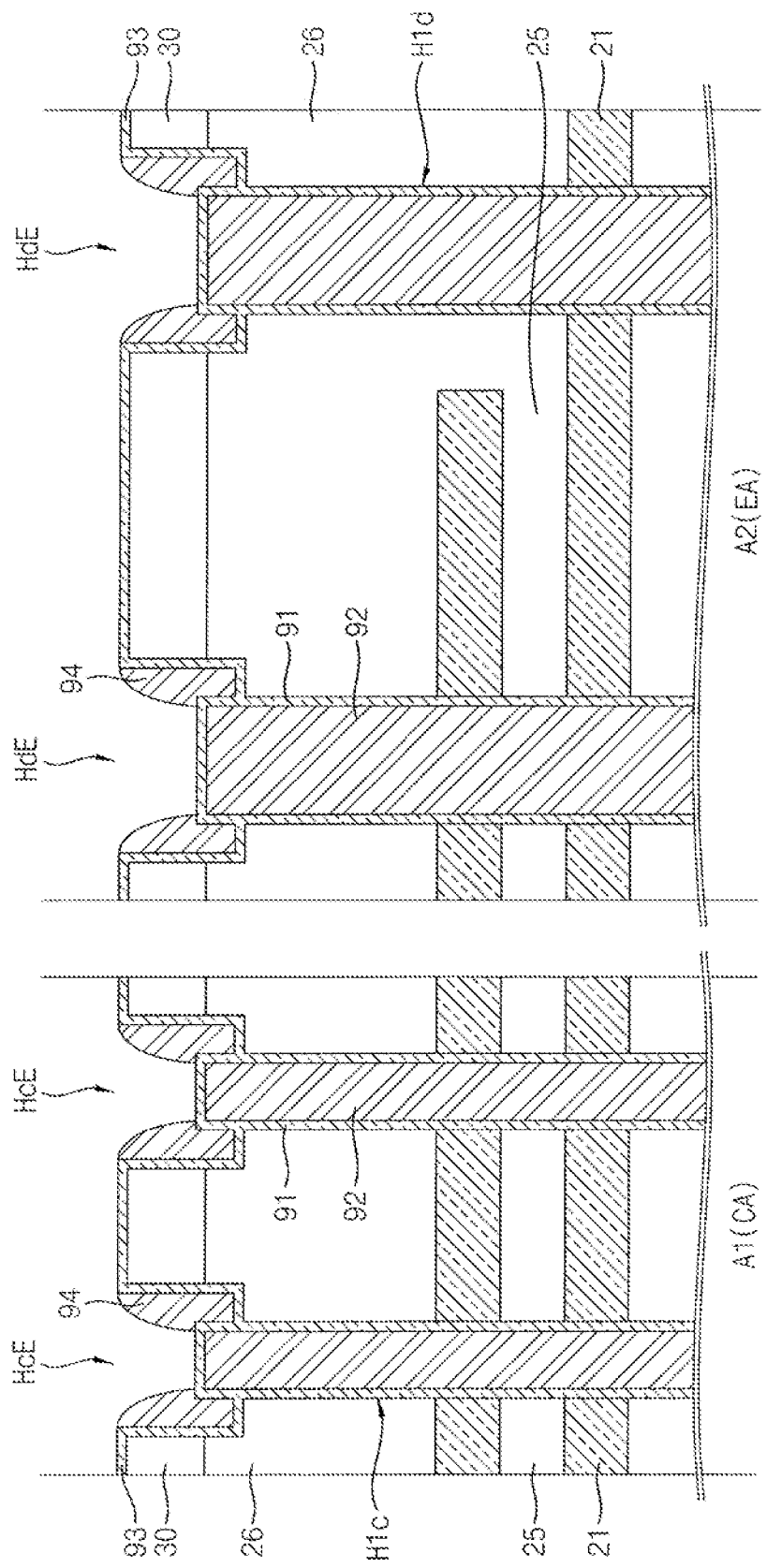

Referring to FIG. 4F, the method may include performing an etch-back process to partially etch the spacer material layer 94a to form spacers 94 on sidewalls of the cell channel hole enlarged portion HcE and the dummy channel hole enlarged portion HdE. The spacer 94 may partially expose the second sacrificial liner 93. For example, the spacers 94 may expose the second sacrificial liner 93 on the upper surface of the middle interlayer dielectric layer 30 and the second sacrificial liner 93 on the upper surface of the first sacrificial gap-filler 92.

Figure 4G:
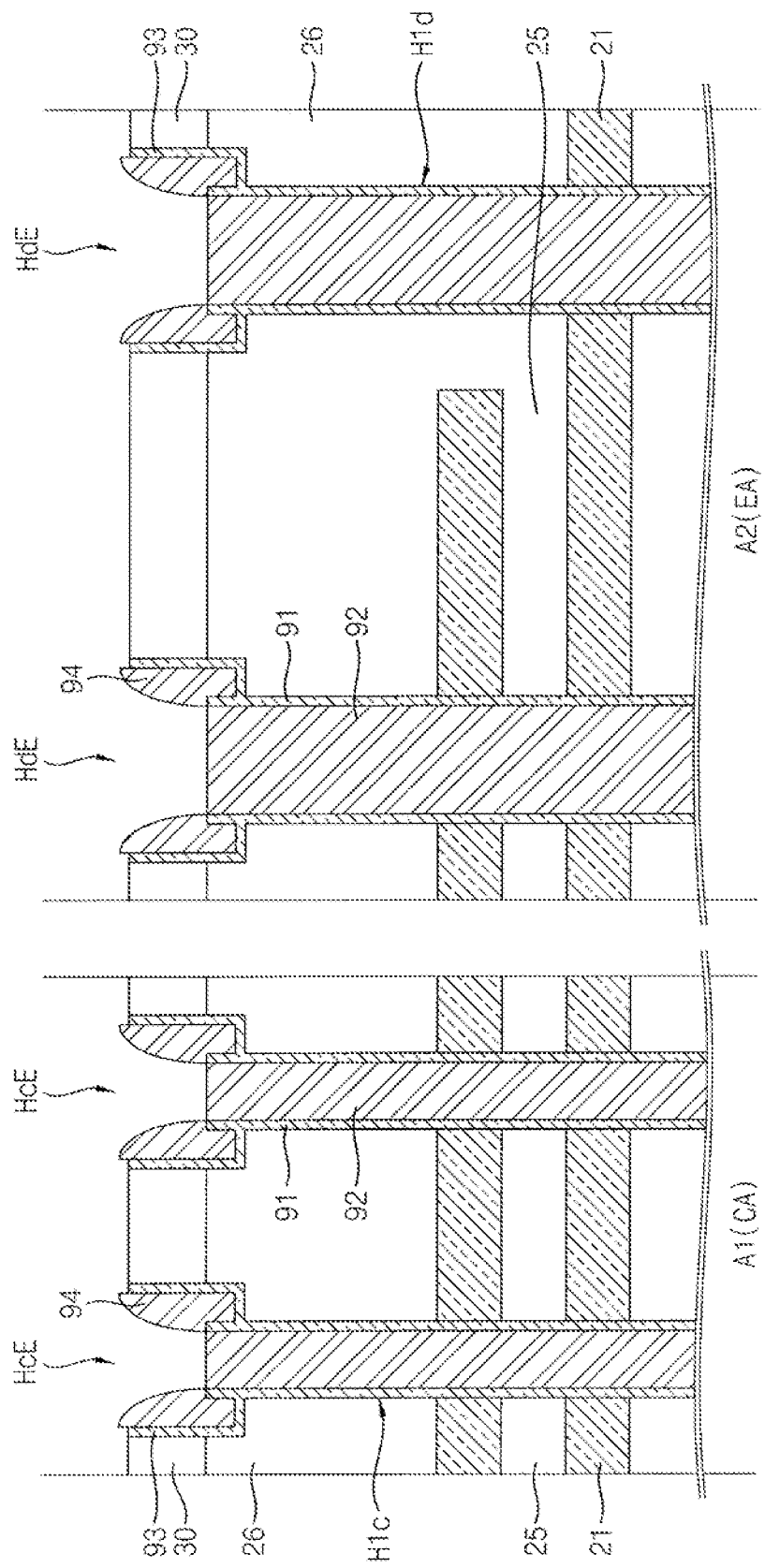

Referring to FIG. 4G, the method may include performing an etch-back process to remove the second sacrificial liner 93 exposed on the first sacrificial gap-filler 92. The second sacrificial liner 93 may be present or remain on the vertical sides and the bottom surface of the spacer 94. The upper ends of the spacer 94 may protrude above the upper surface of the middle interlayer dielectric layer 30 and the upper end of the second sacrificial liner 93 (e.g., away from the substrate 10 in the second direction Y).

Figure 4H:
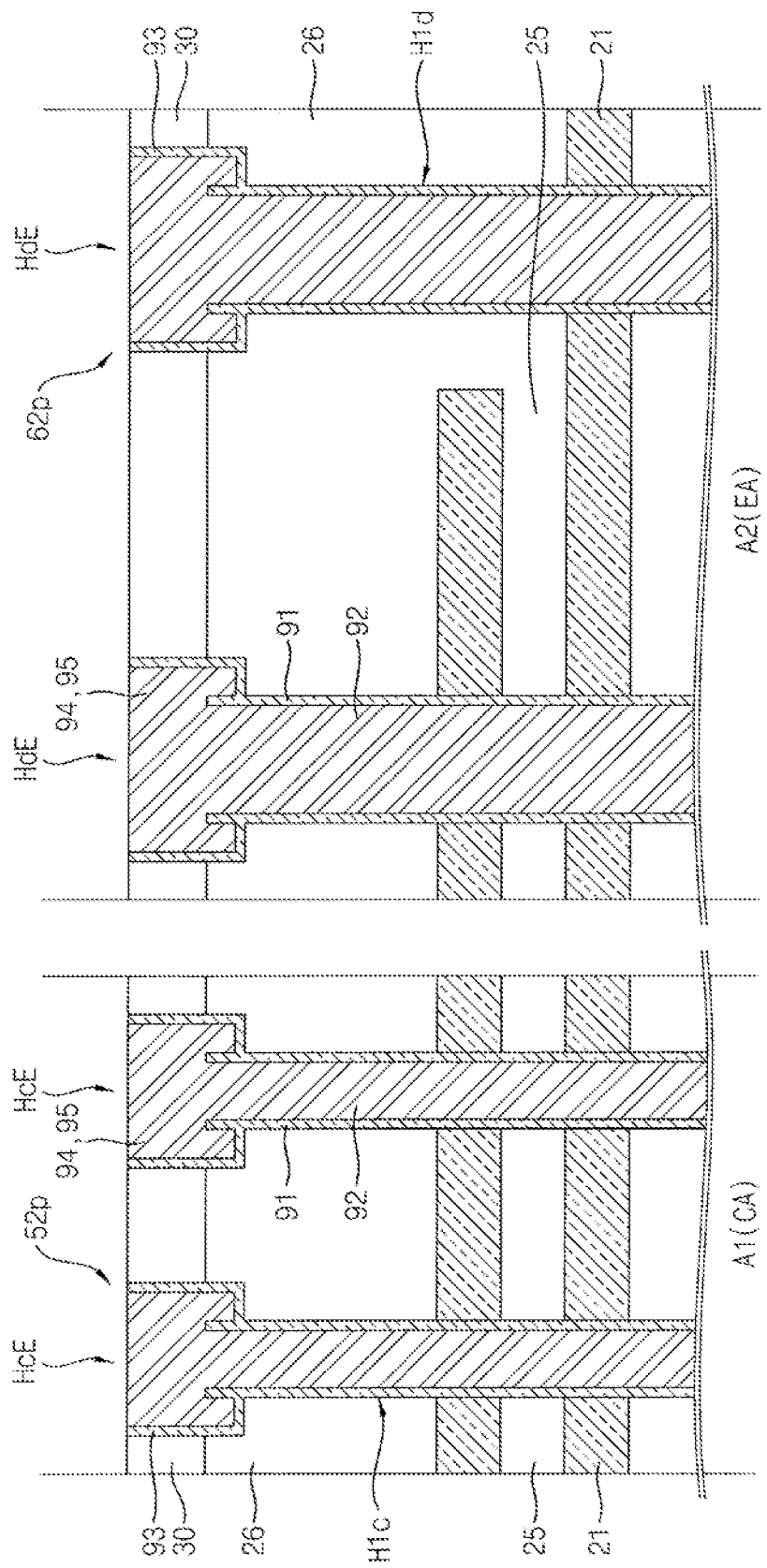
Figure 41:
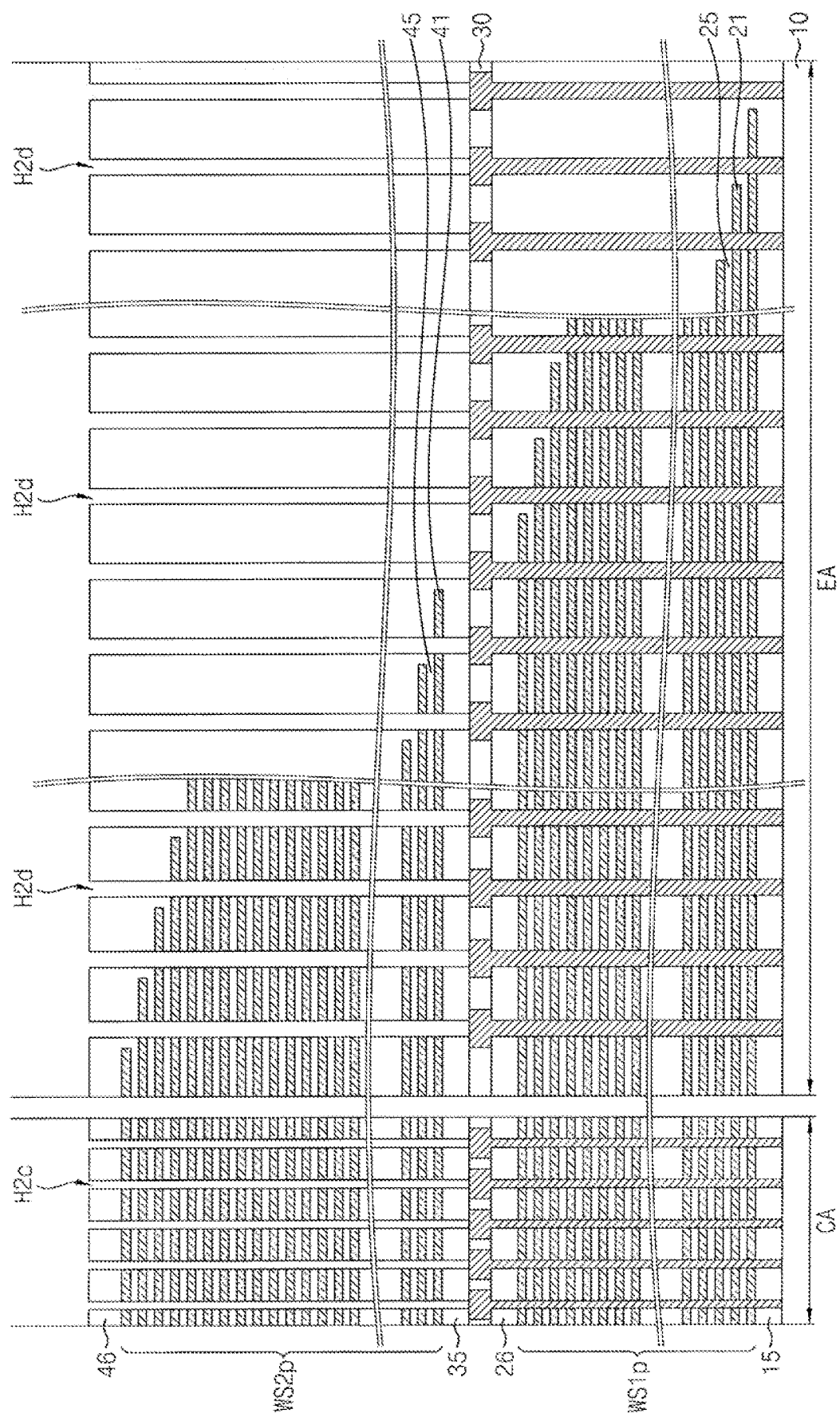

Referring to FIG. 4H, the method may include forming a second sacrificial gap-filler 95 in the cell channel hole enlarged portion HcE and the dummy channel hole enlarged portion HdE, and performing a planarization process such as a CMP to planarize upper surfaces of the second sacrificial gap-filler 95 and the middle interlayer dielectric layer 30 to be co-planar. The second sacrificial gap-filler 95 may include the same material as the spacer 94. For example, the spacer 94 and the second sacrificial gap-filler 95 may be integrated to be materially continuous. During the process, the upper ends of the spacer 94 may also be partially removed. Owing to the process, a preliminary cell channel enlarged portion 52p and a preliminary dummy channel enlarged portion 62p may be formed in the cell channel hole enlarged portion HcE and the dummy channel hole enlarged portion HdE, respectively.

Referring to 4I, the method may include forming an upper interlayer dielectric layer 35, a preliminary upper word line stack WS2p, and a lower capping insulating layer 46 on the middle interlayer dielectric layer 30 and the preliminary cell channel enlarged portion 52p and the preliminary dummy channel enlarged portion 62p, and forming upper cell channel hole H2c and upper dummy channel hole H2d.

The forming of the upper interlayer dielectric layer 35 may include performing a deposition process to form an insulating layer such as silicon oxide on the middle interlayer dielectric layer 30, the preliminary cell channel enlarged portion 52p, and the preliminary dummy channel enlarged portion 62p.

The forming of the preliminary upper word line stack WS2p may include performing deposition processes to alternately stack the upper sacrificial insulating layers 41 and the upper mold insulating layers 45, and performing a staircase forming process to form ends of the upper sacrificial insulating layers 41 into a staircase shape in the extension area EA. The upper sacrificial insulating layers 41 and the upper mold insulating layers 45 may have an etching selectivity. For example, the upper sacrificial insulating layers 41 may include silicon nitride, and the upper mold insulating layers 45 may include silicon oxide.

The forming of the lower capping insulating layer 46 may include performing deposition processes to form insulating layers covering the preliminary upper word line stack WS2p. The upper interlayer dielectric layer 35 and the lower capping insulating layer 46 may include silicon oxide.

The forming of the upper cell channel hole H2c and the upper dummy channel hole H2d may include performing a photolithography process and an etching process to vertically penetrate the upper interlayer dielectric layer 35, the preliminary upper word line stacks WS2p, and lower capping insulating layer 46 to expose surfaces of the preliminary cell channel enlarged portion 52p and the preliminary dummy channel enlarged portion 62p.

Figure 4J:
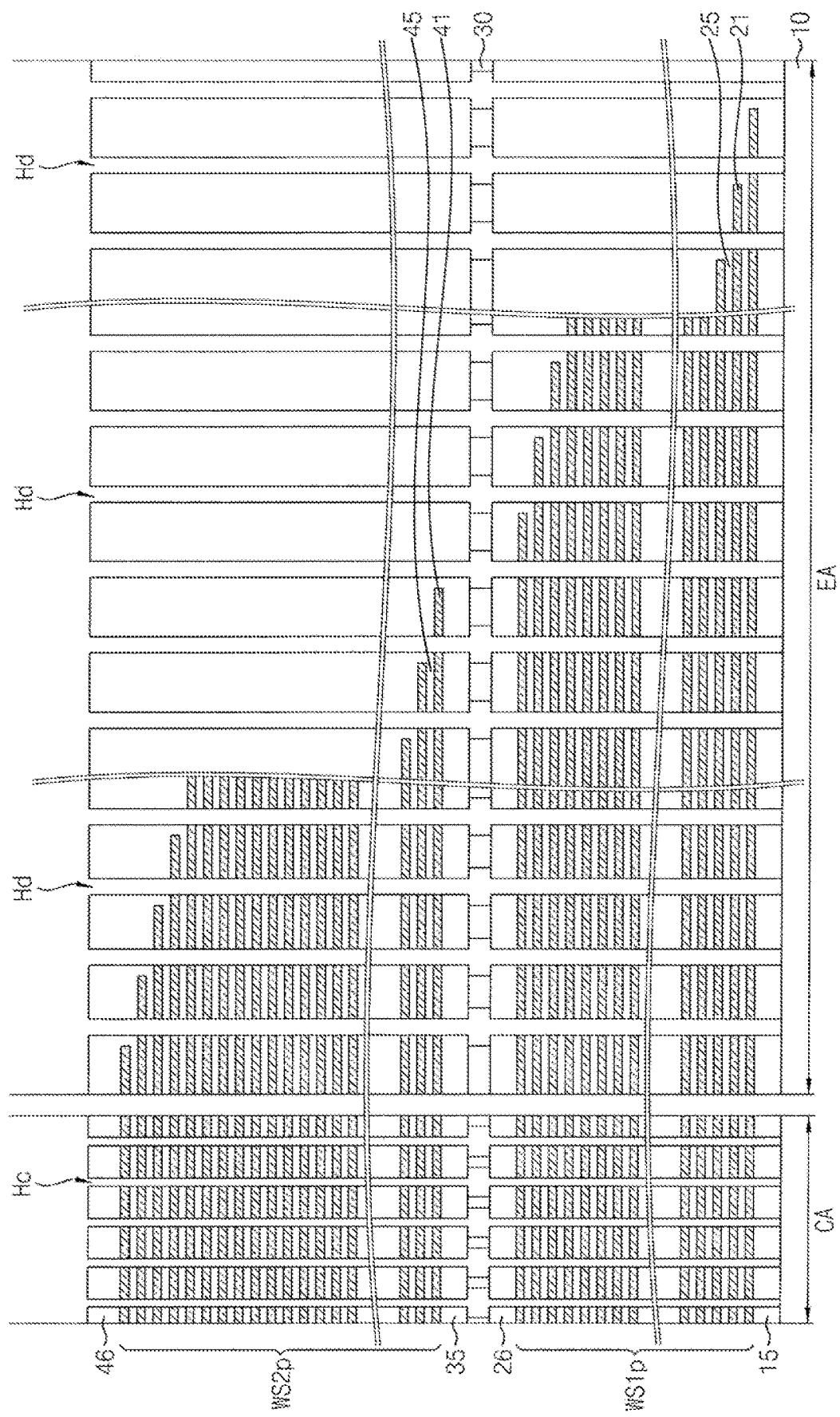

Referring to FIG. 4J, the method may include removing the first sacrificial liner 91, the first sacrificial gap-filler 92, the second sacrificial liner 93, the spacer 94, and the second sacrificial gap-filler 95 in the preliminary cell channel enlarged portion 52p, the lower cell channel hole H1c, the preliminary dummy channel enlarged portion 62p, and the lower dummy channel hole H1d through the upper cell channel hole H2c and the upper dummy channel hole H2d. Owing to the processes, a cell channel hole Hc in the cell area CA and a dummy channel hole Hd in the extension area EA may be formed.

Figure 4K:
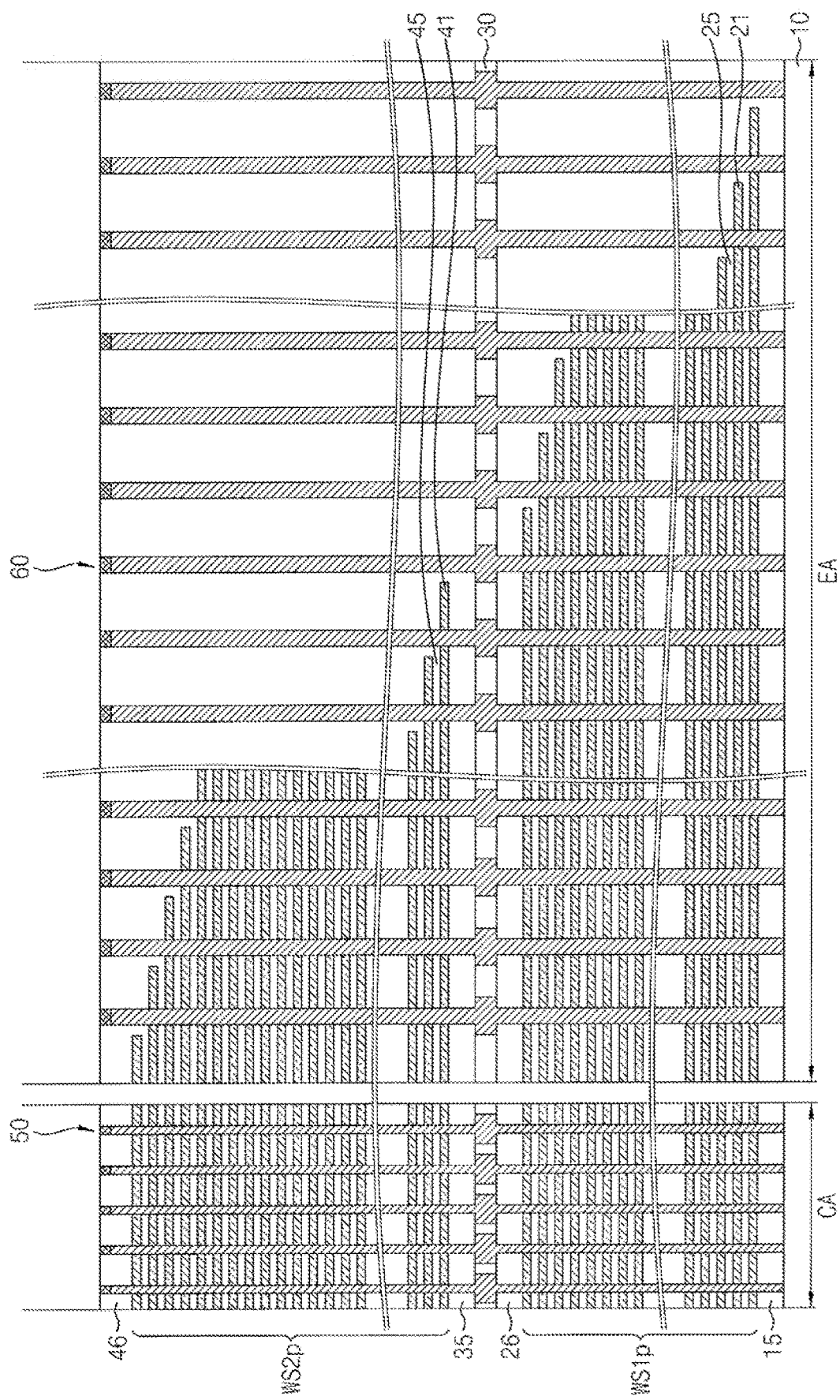

Referring to FIG. 4K, the method may include forming a cell channel structure 50 and a dummy channel structure 60 in the cell channel hole Hc and the dummy channel hole Hd, respectively.

The forming of the cell channel structure 50 and the dummy channel structure 60 may include, further referring to FIG. 1B, conformably forming a cell memory layer 57 on inner walls of the cell channel hole Hc and a dummy memory layer 67 on inner walls of the dummy channel hole Hd, and forming cell gap-fill core 56 filling the cell channel hole Hc and dummy gap-fill core 66 filling the dummy channel hole H2.

The method may further include forming a cell via pad 54 and a dummy via pad 64 on upper ends of the cell channel hole Hc and the dummy channel hole Hd.

The conformally forming of the cell memory layer 57 and the dummy memory layer 67 may include performing an atomic layer deposition (ALD) process, the forming of the cell gap-fill core 56 and the dummy gap-fill core 66 may include performing a gap-fill process, and the forming of the cell via pad 54 and the dummy via pad 64 may include selectively performing a recess process, a deposition process, a silicidation process, a CMP process, or other processes. The reference numerals of the non-illustrated components will be understood with reference to FIG. 1B.

Figure 4L:
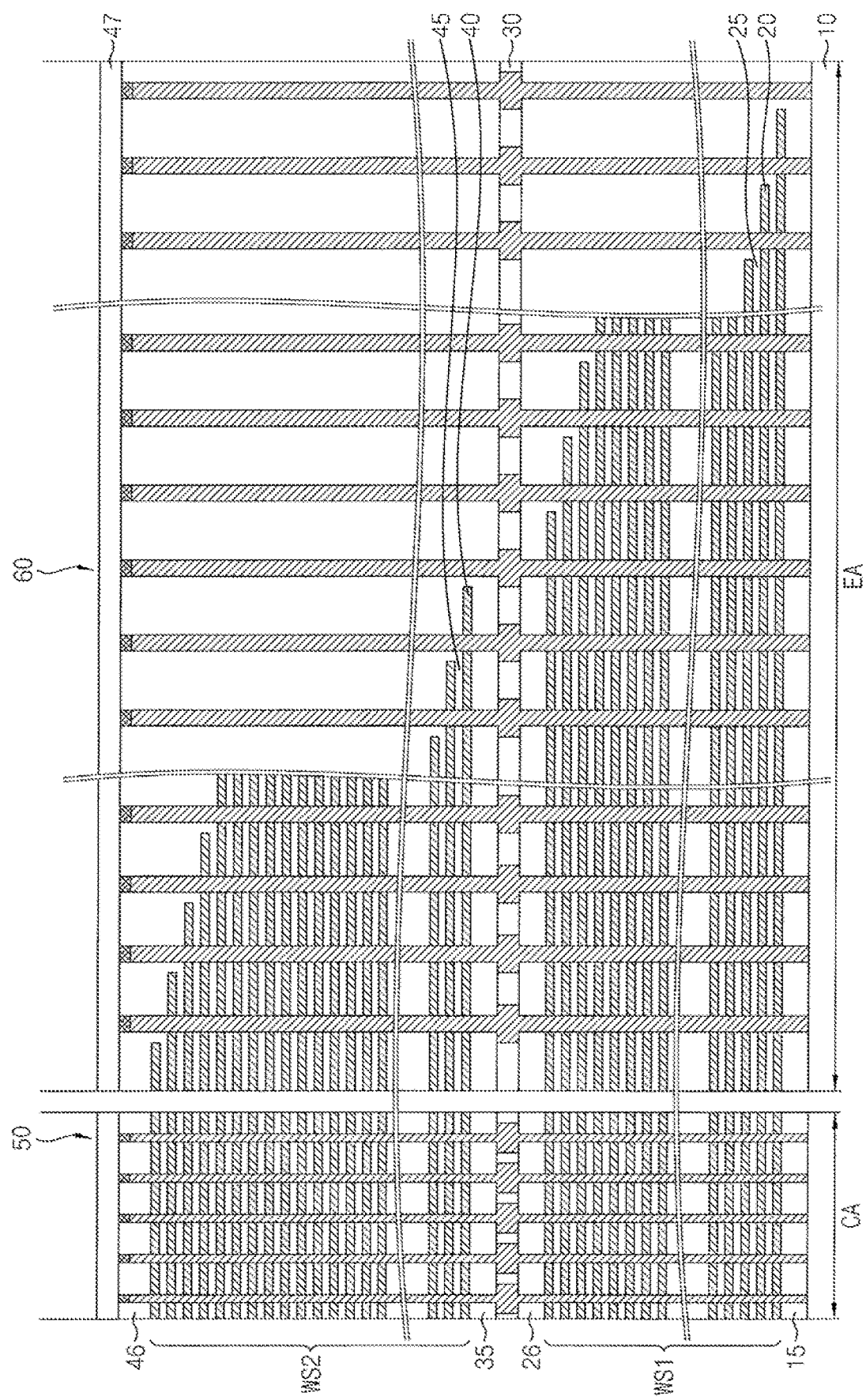

Referring to FIG. 4L, the method may include forming a middle capping insulating layer 47, removing the lower sacrificial insulating layer 21 and the upper sacrificial insulating layer 41, and forming a lower word line 20 and an upper word line 40.

The forming of the middle capping insulating layer 47 may include performing a deposition process to form an insulator including silicon oxide. The lower sacrificial insulating layer 21 and the upper sacrificial layer 41 may be removed by performing a wet etching process.

The forming of the lower word lines 20 and the upper word lines 40 may include performing a deposition process to form conductive materials in the empty space where the lower sacrificial insulating layer 21 and the upper sacrificial layer 41 are removed.

Figure 4M:
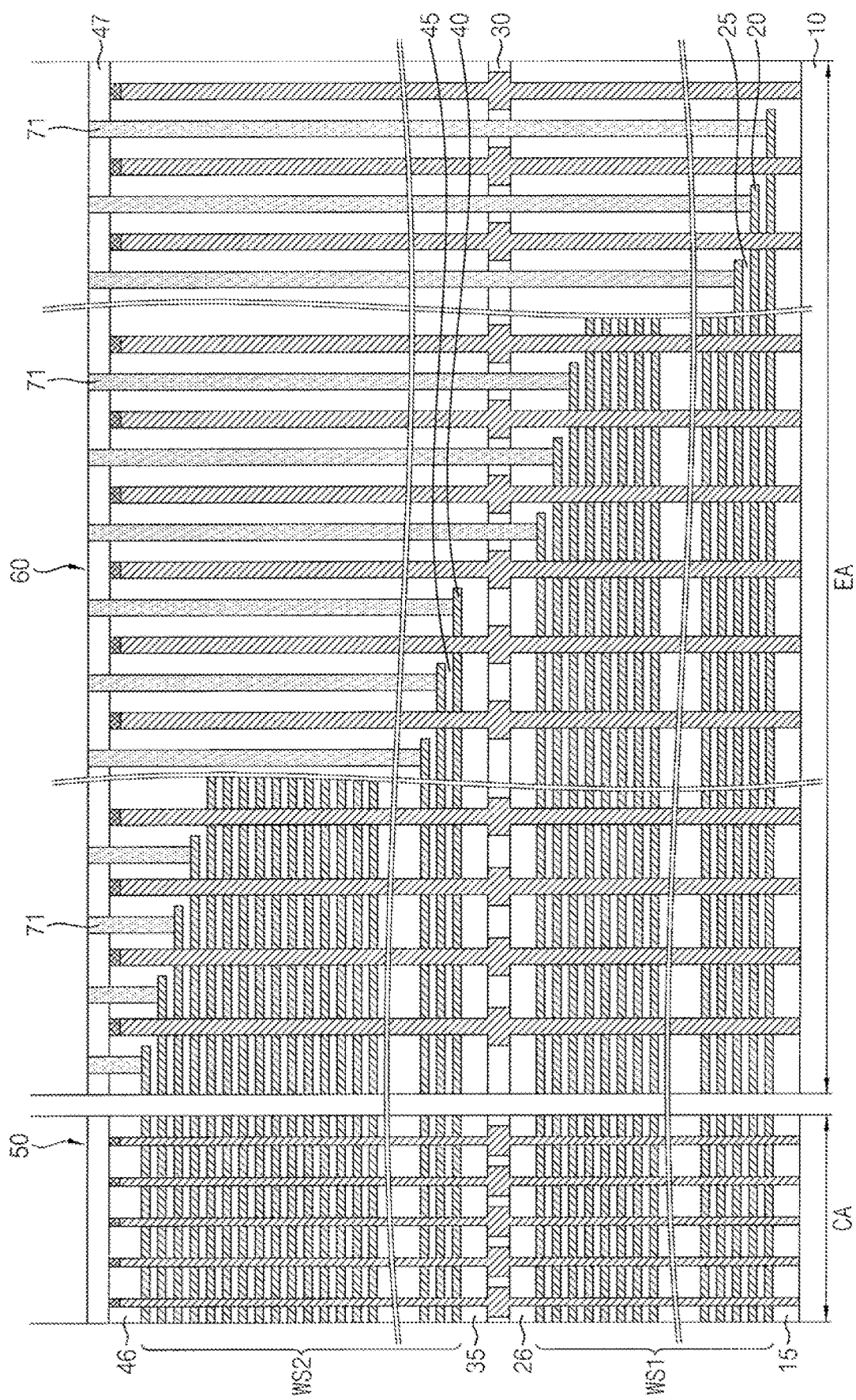

Referring to FIG. 4M, the method may include forming lower contact plugs 71 vertically overlapping and aligned with ends of the lower word lines 20 and the upper word lines 40 having a staircase in the extension area EA. The lower contact plugs 71 may be disposed between the dummy channel structures 60, and electrically and physically connected to one of the lower word lines 20 and the upper word lines 40, respectively.

The dummy channel structure 60 may vertically penetrate the lower word lines 20 and the upper word lines 40 to be connected to the substrate 10, and the lower contact plugs 71 may not penetrate the lower word lines 20 and the upper word lines 40.

The dummy channel structures 60 may have the same vertical height, and the lower contact plugs 71 may have various vertical heights depending on the location level of the connected word lines 20 and 40.

Thereafter, referring to FIGS. 1A and 1B, the method may include forming an upper capping insulating layer 48, forming a cell via plug 55 and an upper contact plug 75, and forming a bit line BL and a word line driving line WDL. The forming of the upper capping insulating layer 48 may include performing a deposition process to form an insulating layer such as silicon oxide. The forming of the cell via plug 55 may include forming a hole vertically penetrating the upper capping insulating layer 48 and the middle capping insulating layer 47 to expose an upper surface of the cell via pad 54, and forming a conductive material such as a metal. The forming of the upper contact plug 75 may include forming a hole vertically penetrating the upper capping insulating layer 48 to expose an upper surface of the lower contact plug 71, and forming a conductive material such as a metal. The method may further include performing a CHIP process after forming the cell via plugs 55 and the upper contact plugs 75. The forming of the bit line BL and the word line driving line WDL may include performing a deposition process, a photolithography process, an etching process, or the like.

Figure 5A:
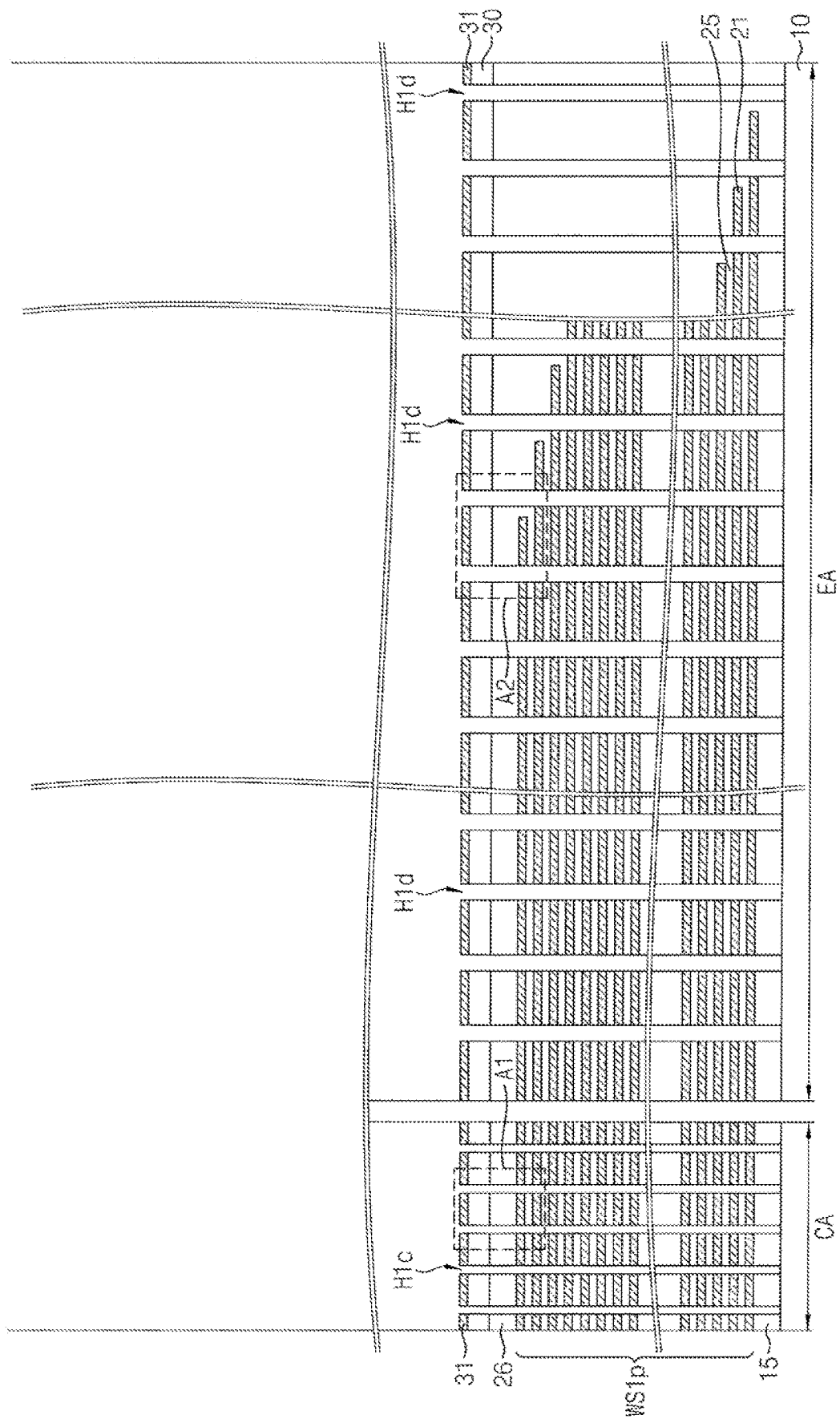
Figure 5B:
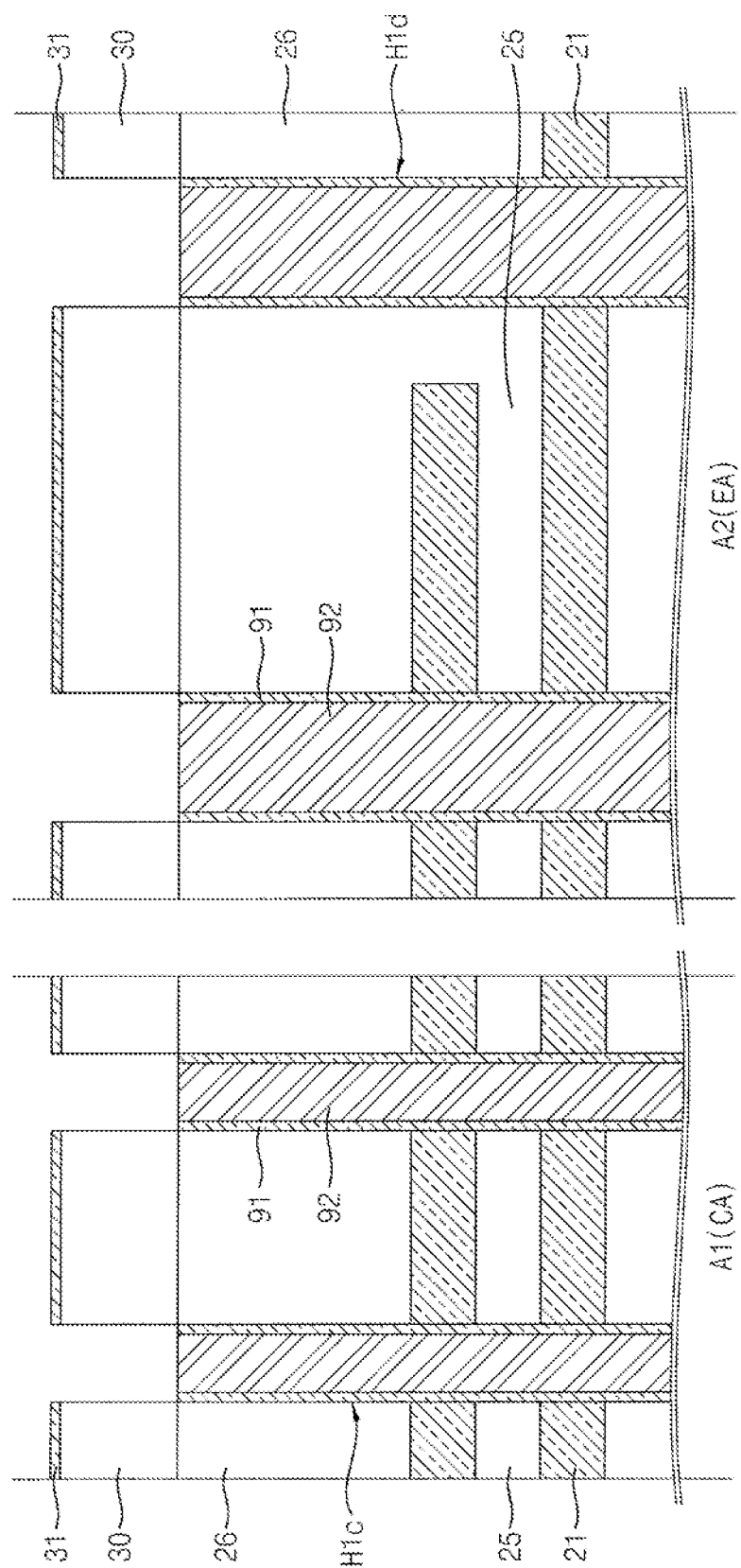

FIGS. 5A to 5C illustrate views of stages in a method of forming a three-dimensional flash memory device in accordance with an embodiment of the present disclosure, of which FIGS. 5B and 5C are enlarged views of the area A1 and the area A2 in FIG. 5A.

Referring to FIG. 5A, the method may include forming a pad insulating layer 15, a preliminary lower word line stack WS1$p$, a lower interlayer dielectric layer 26, a middle interlayer dielectric layer 30, and a protective insulating layer 31 on a substrate 10 (having areas that will define a cell area CA and an extension area EA of the finally-prepared device), and forming a lower cell channel hole H1$c$ and a lower dummy channel hole H1$d$. The protective insulating layer 31 may have an etch selectivity with respect to the middle interlayer dielectric layer 30. For example, the protective insulating layer 31 may include silicon nitride. The processes not described may be understood with reference to FIG. 4A.

Referring to FIG. 5B, the method may include conformally forming a first sacrificial liner 91 on an upper surface of the protective insulating layer 31, and inner walls of the lower cell channel hole H1$c$ and the lower dummy channel hole H1$d$, forming a first sacrificial gap-filler 92 in the lower cell channel hole H1$c$ and the lower dummy channel hole H1$d$, and performing a recess process to recess upper portions of the sacrificial liner 91 and the first sacrificial gap-filler 92 by performing the processes described with reference to FIG. 4C. Owing to the processes, the protective insulating layer 31 may be thinned.

Referring to FIG. 5C, the method may include forming a cell channel hole enlarged portion HcE and a dummy channel hole enlarged portion HdE by performing the process described with reference to FIG. 4D. As compared with FIG. 4D, the protective insulating layer 31 may prevent the upper portion of the middle interlayer dielectric layer 30 from being partially removed. The cell channel hole enlarged portion HcE and the dummy channel hole enlarged portion HdE may include undercut regions UC under the protection insulating layer 31 and recessed portions Rc and Rd in the lower interlayer dielectric layer 26, respectively.

Thereafter, the method may include removing the protective insulating layer 31, and performing the processes described with reference to FIGS. 4E to 4M and FIGS. 1A and 1B to form a three-dimensional flash memory device.

Figure 6B:
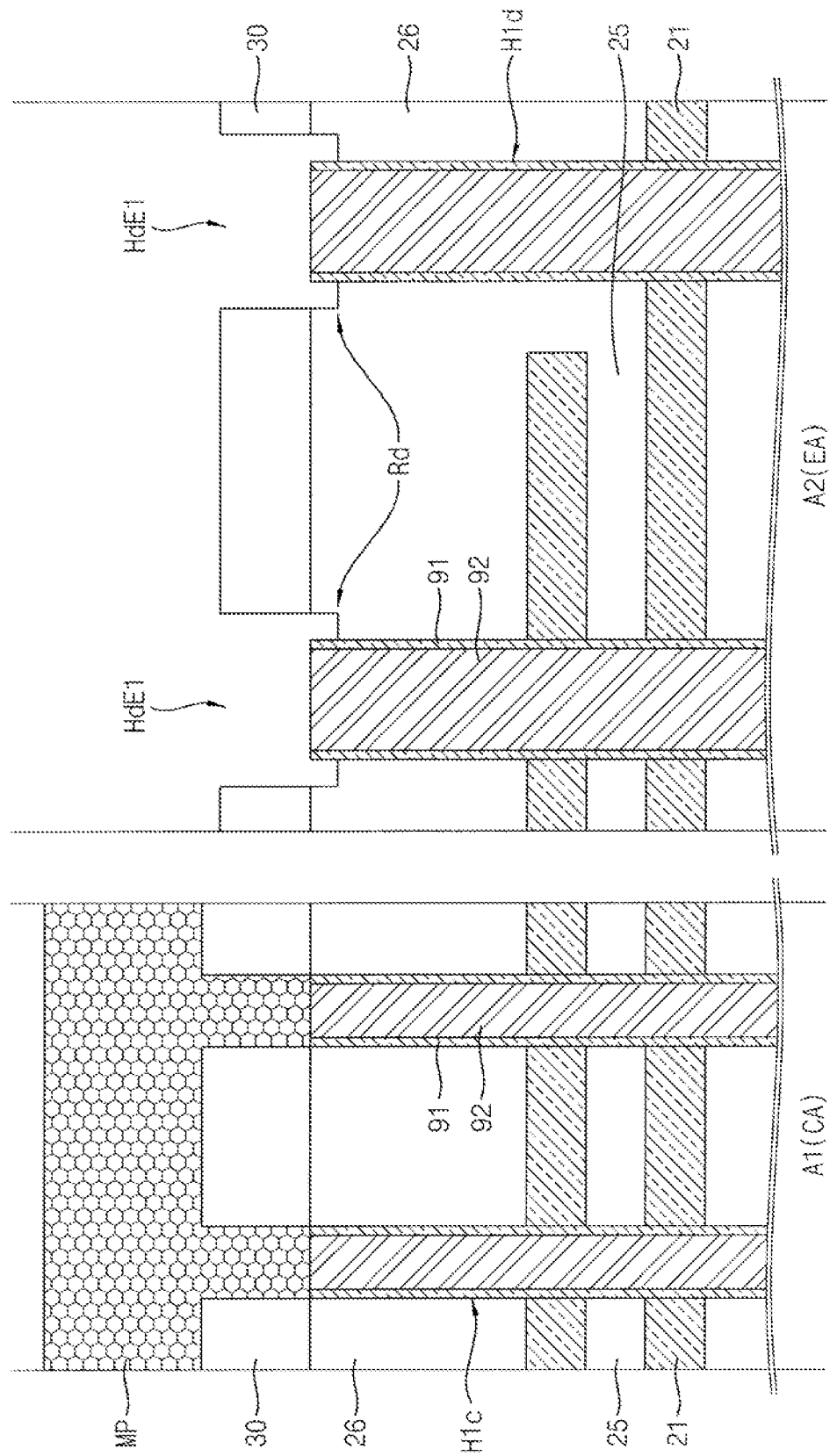
Figure 6C:
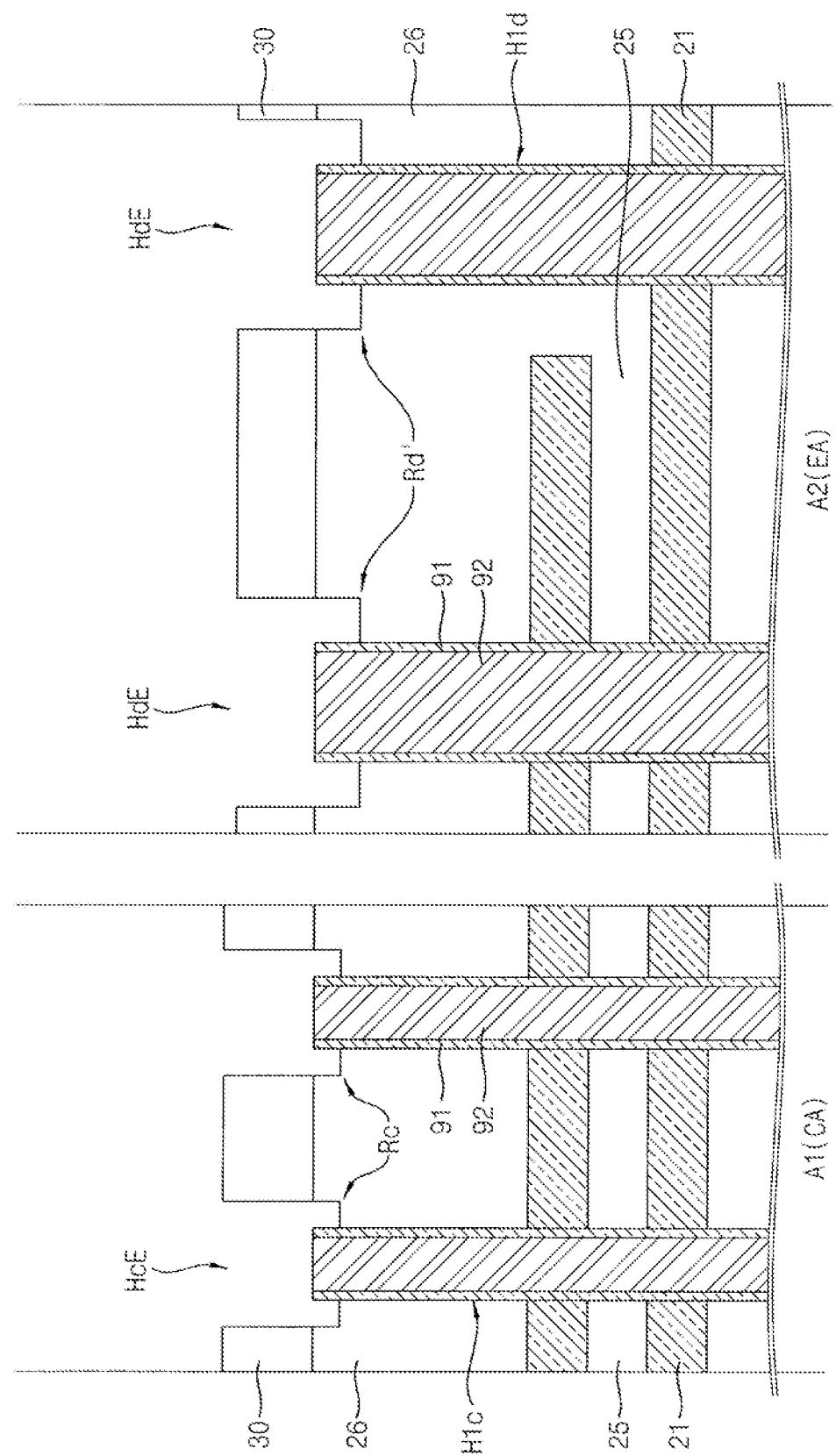

FIGS. 6A to 6C illustrate views of stages in a method of forming a three-dimensional flash memory device in accordance with an embodiment of the present disclosure.

Referring to FIG. 6A, the method may include performing the processes described with reference to FIGS. 4A to 4C and forming a mask pattern MP covering the cell area CA and exposing the extension area EA. The mask pattern MP may include a photoresist pattern.

Referring to FIG. 6B, the method may include partially removing the middle interlayer dielectric layer 30 in the exposed extension area EA to form a preliminarily dummy channel hole enlarged portion HdE1. The partially removing the middle interlayer dielectric layer 30 may include performing an isotropic etching process such as a wet etching process or a radical dry etching process. The preliminarily dummy channel hole enlarged portion HdE1 may have a recessed portion Rd in the lower interlayer dielectric layer 26.

Referring to FIG. 6C, the method may include removing the mask pattern MP, and partially removing the exposed surface of the middle interlayer dielectric layer 30 to form a cell channel hole enlarged portion HcE and a dummy channel hole enlarged portion HdE. The finally enlarged cell channel hole enlarged portion HcE and the finally enlarged dummy channel hole enlarged portion HdE may have recess portions Rc and Rd', respectively. The recessed portion Rd' of the dummy channel hole enlarged portion HdE may be wider and deeper than the recessed portion Rc of the cell channel hole enlarged portion HcE.

Thereafter, the method may include performing the processes described with reference to FIGS. 4E to 4M and FIGS. 2A and 2B to form the two-dimensional flash memory device shown in FIGS. 2A and 2B. In the embodiment, a surface level of the middle interlayer dielectric layer 30 in the extension area EA may be lower than (e.g., closer to the substrate 10 in the second direction Y than) a surface level of the interlayer dielectric layer 30 in the cell area CA.

Figure 7A:
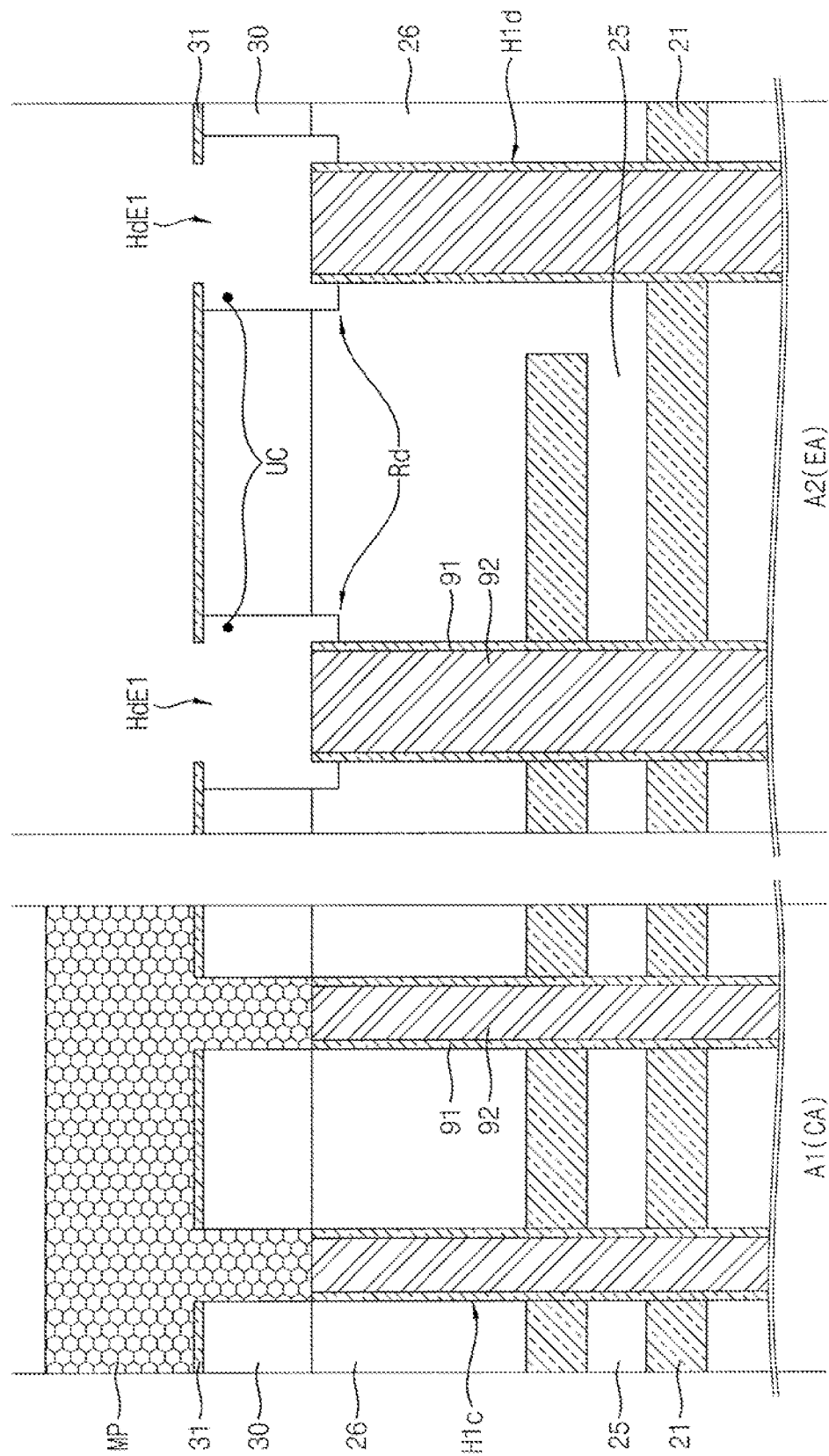

FIGS. 7A and 7B illustrate views of stages in a method of forming a three-dimensional flash memory device in accordance with an embodiment of the present disclosure.

Referring to FIG. 7A, the method may include performing the processes described with reference to FIGS. 5A to 5C and 6A to form a protective insulating layer 31 and a mask pattern MP, and performing an isotropic etching process to form a preliminarily dummy channel hole enlarged portion HdE1. The preliminarily dummy channel hole enlarged portion HdE1 may have an undercut region UC under the protective insulating layer 31 and a recessed portion Rd in the lower interlayer dielectric layer 26.

Referring to FIG. 7B, the method may include removing the mask pattern MP, and performing an isotropic etching process to form a cell channel hole enlarged portion HcE and a dummy channel hole enlarged portion HdE. Both of the cell channel hole enlarged portion HcE and the dummy channel hole enlarged portion HdE may have the undercut regions UC under the protective insulating layer 31 and the recessed portions Rc and Rd'. The recessed portion Rd' of the dummy channel hole enlarged portion HdE may be wider and deeper than the recessed portion Rc of the cell channel hole enlarged portion HcE.

Thereafter, the method may include removing the protective insulating layer 31, performing the processes described with reference to FIGS. 4E to 4M and 1A and 1B to form the three-dimensional flash memory device described with reference to FIGS. 2A and 2B.

FIG. 8 illustrates a diagram of a stage in a method of forming a three-dimensional flash memory device in accordance with an embodiment of the present disclosure.

Referring to FIG. 8, the method may include performing the processes described with reference to FIGS. 4A and 4B, or FIGS. 4A to 4C, and performing a photolithography process to form a cell mask pattern MP having a first opening HcO exposing a lower cell channel hole Hic in the cell area CA and a second opening HdO exposing a lower dummy channel hole H1$d$ in the extension area EA, and selectively performing an etching process using the mask pattern MP as an etch mask to form a cell channel hole enlarged portion HcE and a dummy channel hole enlarged portion HdE. A diameter or a horizontal width Wc (e.g., in the first direction X) of the second openings HdO may be greater than a diameter or a horizontal width Wd of the first openings HcO (e.g., in the first direction X). For example, the dummy channel hole enlarged portion HdE may be wider than the cell channel hole enlarged portion HcE.

Thereafter, the method may include removing the mask pattern MP and performing the processes described with reference to FIGS. 4E to 4M and FIGS. 1A and 1B to form the three-dimensional flash memory device described with reference to FIGS. 2A and 2B.

Figure 9:
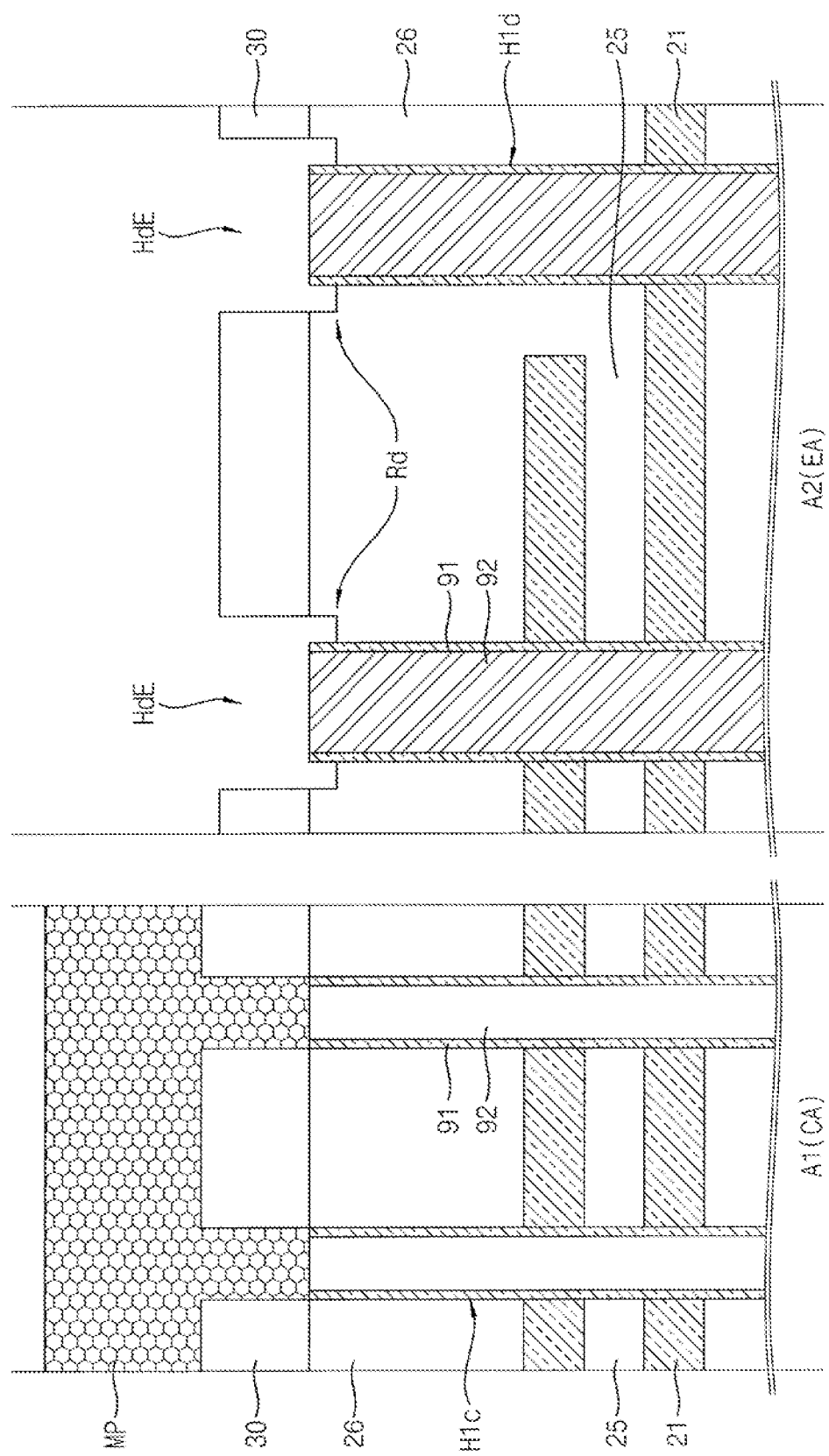
FIG. 9 illustrates a view of a stage in a method of forming a three-dimensional flash memory device in accordance with an embodiment of the present disclosure.

FIG. 9 illustrates a view of a stage in a method of forming a three-dimensional flash memory device in accordance with an embodiment of the present disclosure.

Referring to FIG. 9, the method may include performing the processes described with reference to FIGS. 5A and 5B, forming a mask pattern MP covering the cell area CA and exposing the extension area EA, and performing an isotropic etching process to form a dummy channel hole enlarged portion HdE in the extension area EA. The exposed surfaces of the middle interlayer dielectric layer 30 in the extension area EA may be partially removed.

For example, the method may include removing the mask pattern MP and performing the processes described with reference to FIGS. 4E to 4M and FIGS. 1A and 1B to form the three-dimensional flash memory device described with reference to FIGS. 3A and 3B. In the embodiment, a surface level of the middle interlayer dielectric layer 30 in the extension area EA may be lower than a surface level of the middle interlayer dielectric layer 30 in the cell area CA.

FIG. 10 illustrates a view of a stage in a method of forming a three-dimensional flash memory device in accordance with an embodiment of the present disclosure.

Referring to FIG. 10, the method may include performing the processes described with reference to FIGS. 5A and 5B, forming a mask pattern MP covering the cell area CA and exposing the extension area EA, and performing an isotropic etching process to form dummy channel hole enlarged portion HdE in the extension area EA. A surface of the middle interlayer dielectric layer 30 in the extension area EA may be protected by the protective insulating layer 31.

Thereafter, the method may include removing the mask pattern MP and the protective insulating layer 31 performing the processes described with reference to FIGS. 4E to 4M and FIGS. 1A and 1B to form the three-dimensional flash memory device described with reference to FIGS. 3A and 3B. In the embodiment, a surface level of the middle interlayer dielectric layer 30 may be the same in the cell area CA and the extension area EA.

Figure 11C:
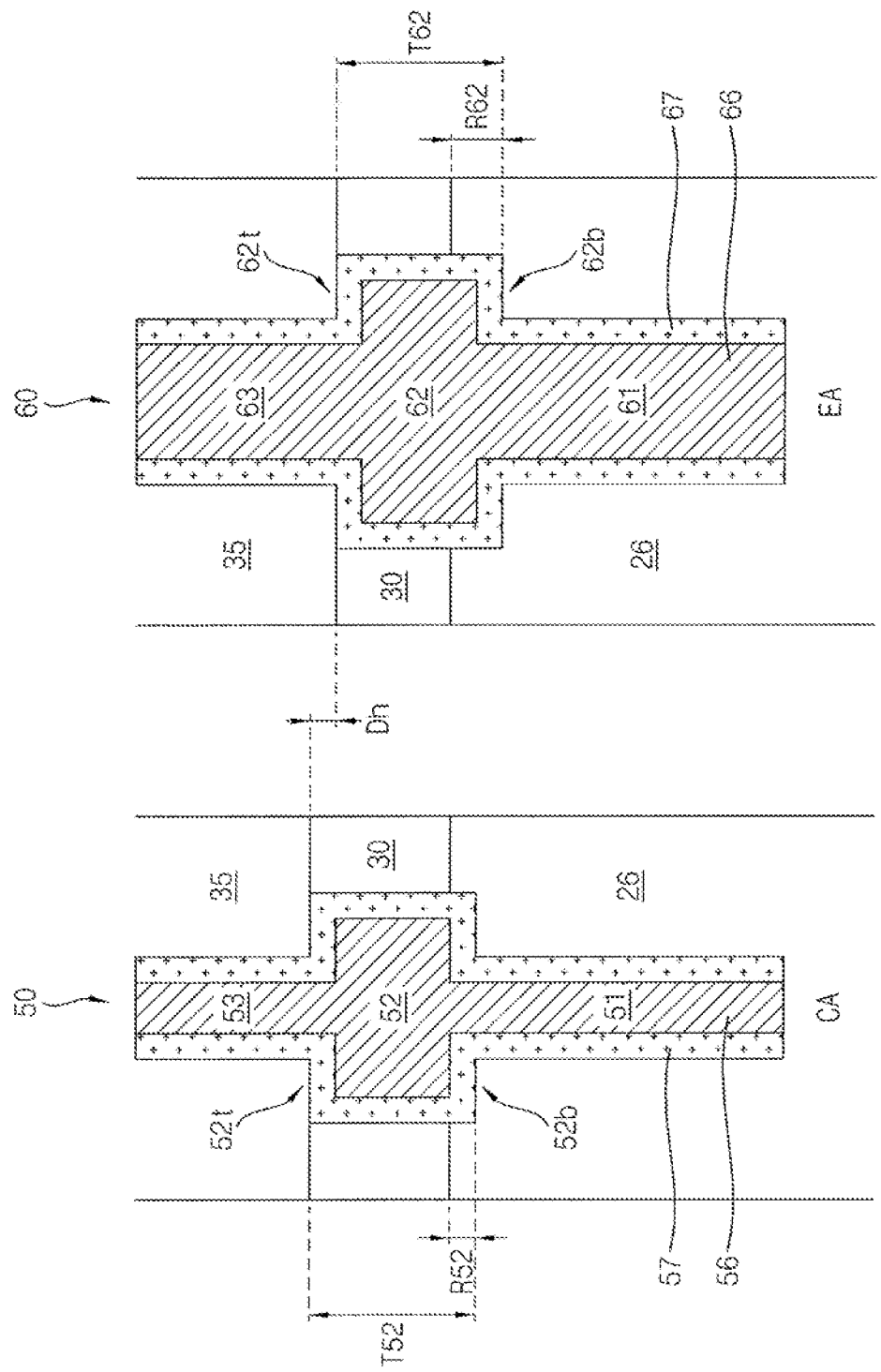

FIGS. 11A to 11C illustrate enlarged views of a portion of a cell channel structure 50 and a portion of a dummy channel structure 60 of a three-dimensional flash memory device in accordance with an embodiment of the present disclosure.

Referring to FIG. 11A, a bottom surface 62b (e.g., substrate-facing surface) of the dummy channel enlarged portion 62 of the dummy channel structure 60 and a bottom surface 52b of the cell channel enlarged portion 52 of the cell channel structure 50 may be at a lower level than (e.g., closer to the substrate 10 in the second direction Y than) a bottom surface of the insulating layer 30 (or an upper surface of the lower interlayer dielectric layer 26). A recess depth R62 of the bottom surface 62b of the dummy channel enlarged portion 62 and the recess depth R52 of the bottom surface 52b of the cell channel enlarged portion 52 (e.g., into the lower interlayer dielectric layer 26 in the second direction Y) may be similar to or substantially the same. (R62=R52) A vertical thickness T62 of the dummy channel enlarged portion 62 (e.g., in the second direction nY) and the vertical thickness T52 of the cell channel enlarged portion 52 may be similar to or substantially the same. (T62=T52) In addition, with reference to FIGS. 4A to 4M and/or FIGS. 5A to 5C, the features of the technical idea of the present disclosure described with reference to FIG. 11A may be sufficiently understood.

Referring to FIG. 11B, a vertical thickness T62 of the dummy channel enlarged portion 62 of the dummy channel structure 60 may be thicker or greater than a vertical thickness T52 of the cell channel enlarged portion 52 of the cell channel structure 50. (T62>T52) In the cell area CA, the bottom surface 52b of the cell channel enlarged portion 52 may be at a level lower (e.g., by the first recess depth R52) than the upper surface of the lower interlayer dielectric layer 26 (i.e., a bottom surface of the middle interlayer dielectric layer 30). In the extension area EA, the bottom surface 62b of the dummy channel enlarged portion 62 may be at a lower level (e.g., by the second recess depth R62) than the bottom surface 52b of the cell channel enlarged portion 52. (R62>R52) In addition, referring to FIGS. 7A and 7B, the features of the technical idea of the present disclosure described with reference to FIG. 11B will be sufficiently understood.

Referring to FIG. 11C, a vertical thickness T62 of the dummy channel enlarged portion 62 of the dummy channel structure 60 may be thicker than a vertical thickness T52 of the cell channel enlarged portion 52 of the cell channel structure 50. (T62>T52) The upper surface of the middle interlayer dielectric layer 30 (e.g., the surface facing away from the substrate 10 in the second direction Y) in the extension area EA may be at a lower level than the upper surface of the interlayer dielectric layer 30 in the cell area CA. In the cell area CA, the bottom surface 52b of the cell channel enlarged portion 52 may be at level lower (e.g., by the first recess depth R52) than the upper surface of the lower interlayer dielectric layer 26. (i.e., the bottom surface of the middle interlayer dielectric layer 30). In the extension area EA, the bottom surface 62b of the dummy channel enlarged portion 62 may be at lever lower (e.g., by the second recess depth R62) than the upper surface of the lower interlayer dielectric layer 26 (i.e., the bottom surface of the middle interlayer dielectric layer 30). For example, a sum of a height difference Dh between the upper surface of the middle interlayer dielectric layer 30 in the cell area CA and the upper surface of the middle interlayer dielectric layer 30 in the extension area EA, and the recess depth R52 of the bottom surface 52b of the cell channel enlarged portion 52 may be similar to or substantially the same as the recess depth R62 of the bottom surface 62b of the dummy channel enlarged portion 62. In addition, with further reference to FIGS. 6A to 6C, the features of the technical idea of the present disclosure described with reference to FIG. 11B will be sufficiently understood.

FIGS. 12A to 12D illustrate enlarged views of a portion of a cell channel structure 50 and a portion of a dummy channel structure 60 of a three-dimensional flash memory device in accordance with various embodiments of the present disclosure.

Figure 12A:
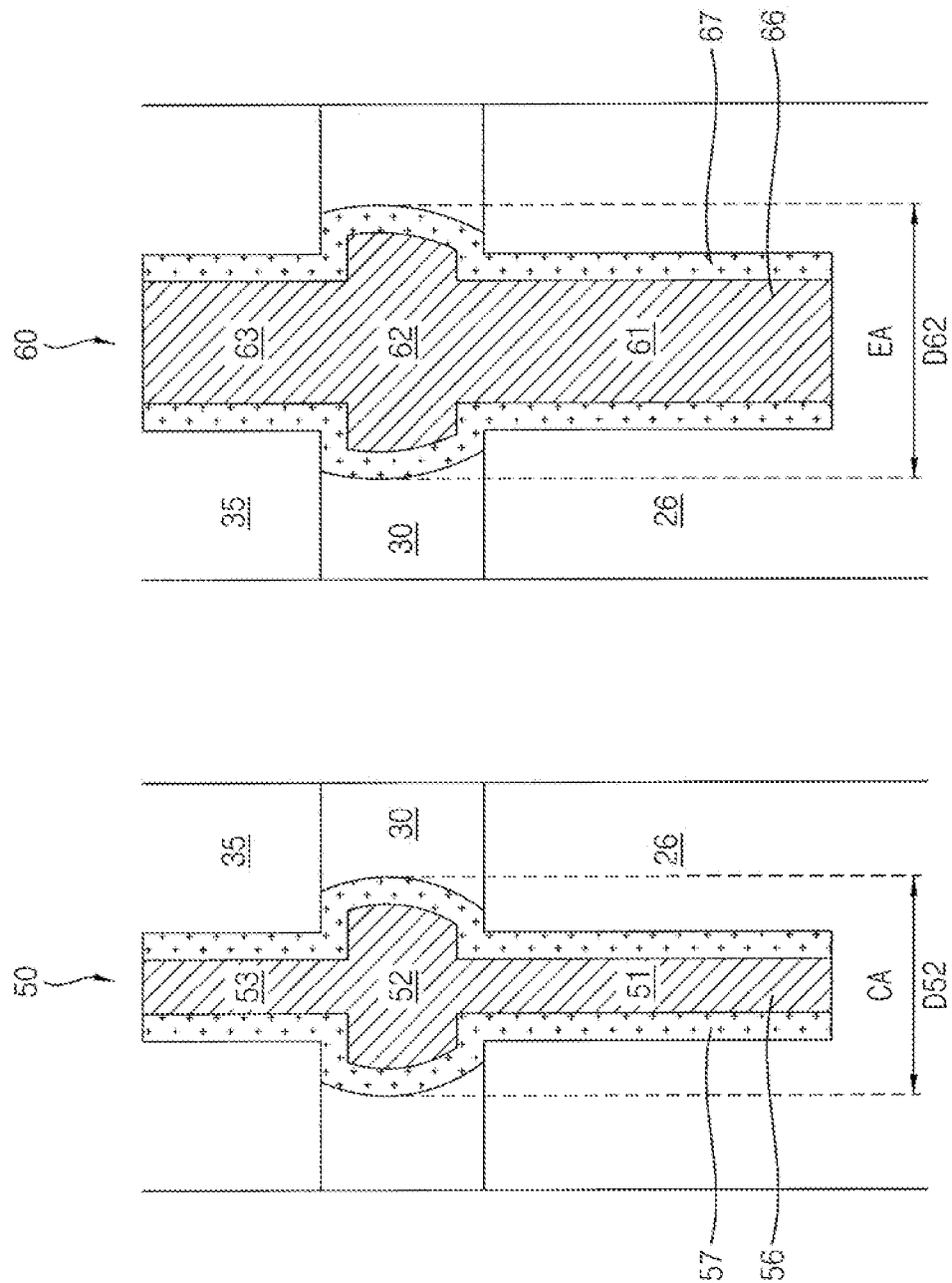

Referring to FIG. 12A, the cell channel enlarged portion 52 of the cell channel structure 50 and the dummy channel enlarged portion 62 of the dummy channel structure 60 may have rounded side surfaces. For example, when an isotropic etching process is performed to form the cell channel hole enlarged portion HcE and the dummy channel hole enlarged portion HdE, inner sides (i.e. side surfaces) of the cell channel hole enlarged portion HcE and the dummy channel hole enlarged portion HdE may be rounded. For example, the cell channel enlarged portion 52 and dummy channel enlarged portion 62 may have spherically rounded side surfaces. A horizontal diameter D62 (e.g., in the first direction X) of the dummy channel enlarged portion 62 may be greater than a horizontal diameter D52 of the cell channel enlarged portion (in the first direction X). (e.g., D62>D52)

Referring to FIG. 12B, the bottom surface 62b of the dummy channel enlarged portion 62 may be at a lower level than the bottom surface 52b of the cell channel enlarged portion 52. For example, the recessed depth R62 of the bottom surface 62b of the dummy channel enlarged portion 62 recessed from the bottom surface of the middle interlayer dielectric layer 30 (or the upper surface of the lower interlayer dielectric layer 26) may be greater than the depth R52 of the bottom surface 52b of the cell channel enlarged portion 52 recessed from the bottom surface of the middle interlayer dielectric layer 30 (or the upper surface of the lower interlayer dielectric layer 26). (R62>R52) The bottom surface 62b of the dummy channel enlarged portion 62 may be a location or plane connected to the lower dummy channel structure 61, and the bottom surface 52b of the cell channel enlarged portion 52 may be a location or plane connected to the lower cell channel structure 51. The features described with reference to FIG. 12A can be further applied.

Figure 12C:
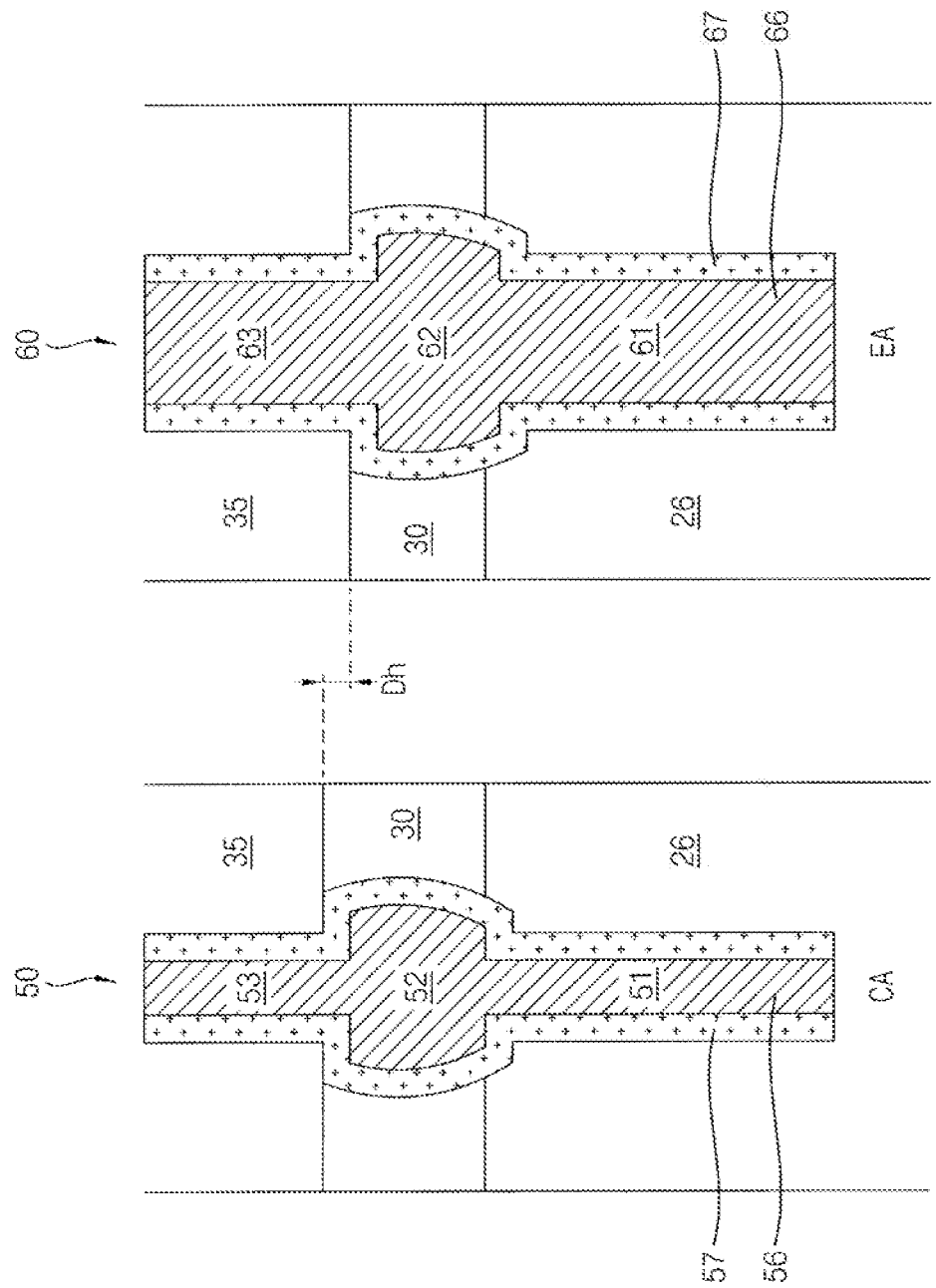

Referring to FIG. 12C, the upper surface of the middle interlayer dielectric layer 30 in the extension area EA may be at a lower level than the interlayer dielectric layer 30 in the cell area CA. For example, the upper end of the dummy channel enlarged portion 62 may be at a lower level than the upper end of the cell channel enlarged portion 52. The features described with reference to FIGS. 12A and 12B can be further applied.

Referring to FIG. 12D, the cell channel enlarged portion 52 and the dummy channel enlarged portion 62 may further include additional enlarged portions 52s and 62s, respectively, in the lower interlayer dielectric layer 26. In an implementation, the lower interlayer dielectric layer 26 may be further etched due to the etch selectivity of the middle interlayer dielectric layer 30 and the lower interlayer dielectric layer 26. The additional enlarged portion 52s of the cell channel enlarged portion 52 and the additional enlarged portion 62s of the dummy channel enlarged portion 62 may be formed in the lower interlayer dielectric layer 26. The additional enlarged portion 62s of the dummy channel enlarged portion 62 may be larger than the additional enlarged portion 52s of the cell channel enlarged portion 52. For example, the horizontal width (diameter) and the vertical thickness of the additional enlarged portion 62s of the dummy channel enlarged portion 62 may be greater than the horizontal width (diameter) of the additional enlarged portion 52s of the cell channel enlarged portion 52. In an implementation, a lower end of the additional enlarged portion 62s of the dummy channel enlarged portion 62 may be at a lower level than a lower end of the additional enlarged portion 52s of the cell channel enlarged portion 52. A radius of curvature of outer surfaces of the additional enlarged portions 52s and 62s may be greater than a radius of curvature of outer surfaces of the cell channel enlarged portion 52 and dummy channel enlarged portion 62, respectively. The features described with reference to FIGS. 12A to 12D can also be applied to other embodiments.

By way of summation and review, when stacking two unit memory devices, aligning the lower unit memory device and the vertical channel structure of the upper unit memory device may be important.

One or more embodiments may provide a three-dimensional flash memory device including channel structures having channel enlarged portions.

One or more embodiments may provide methods of fabricating three-dimensional flash memory devices including channel structures with channel enlarged portions.

According to the embodiments of the present disclosure, in the three-dimensional flash memory devices, vertical alignment of channel structures may be facilitated.

According to the embodiments of the present disclosure, the three dimensional flash memory devices may help prevent word line bridging or channel cut phenomenon that could otherwise occur due to misalignment.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming a three-dimensional flash memory device, the method comprising:
providing a substrate including a cell area and an extension area;
forming a preliminary lower word line stack, a lower interlayer dielectric layer, and a middle interlayer dielectric layer on the substrate;
forming lower cell channel holes and lower dummy channel holes vertically penetrating the preliminary lower word line stack, the lower interlayer dielectric layer, and the middle interlayer dielectric layer, the lower cell channel holes are formed in the cell area, and the lower dummy channel holes are formed in the extension area;
forming a first sacrificial liner covering inner walls of each of the lower cell channel holes and the lower dummy channel holes;
forming a first sacrificial gap filler filling each of the lower cell channel holes and the lower dummy channel holes;
partially removing upper portions of each of the first sacrificial liner and the first sacrificial gap filler;
forming cell channel hole enlarged portion and dummy channel hole enlarged portion by partially removing surface portions of the middle interlayer dielectric layer;
forming a second sacrificial liner in the cell channel hole enlarged portion and the dummy channel hole enlarged portion;
forming spacers on sidewalls of the cell channel hole enlarged portion and the dummy channel hole enlarged portion;
partially removing the second sacrificial liner to expose the first sacrificial gap filler; forming a preliminary cell channel enlarged portion and a preliminary dummy channel enlarged portion in the cell channel hole enlarged portion and the dummy channel hole enlarged portion, respectively;
forming an upper interlayer dielectric layer, a preliminary upper word line stack, and a lower capping insulating layer on the middle interlayer dielectric layer, the preliminary cell channel enlarged portion, and the preliminary dummy channel enlarged portion; and
forming cell channel holes in the cell area and dummy channel holes in the extension area.

2. The method of claim 1, wherein each of the cell channel hole enlarged portion and the dummy channel hole enlarged portion includes a recessed portion having a ring shape in a top view.

3. The method of claim 1, wherein forming the spacers includes:

forming a spacer material layer on the second sacrificial liner; and
partially exposing the second sacrificial liner by partially etching the spacer material layer through an etch-back process.

4. The method of claim 1, wherein forming the preliminary cell channel enlarged portion and the preliminary dummy channel enlarged portion includes:
forming a second sacrificial gap filler in the cell channel hole enlarged portion and the dummy channel hole enlarged portion; and
performing a planarization process to make an upper surface of the second sacrificial gap filler and an upper surface of the middle interlayer dielectric layer have a coplanar surface.

5. The method of claim 1, wherein forming the cell channel holes in the cell area and the dummy channel holes in the extension area includes:
forming upper cell channel holes and upper dummy channel holes passing through the upper interlayer dielectric layer, the preliminary upper word line stack, and the lower capping insulating layer.

6. The method of claim 5, wherein:
the upper cell channel holes expose the preliminary cell channel enlarged portion; and
the upper dummy channel holes expose the preliminary dummy channel enlarged portion.

7. The method of claim 5, wherein forming the cell channel holes in the cell area and the dummy channel holes in the extension area includes:
removing the preliminary cell channel enlarged portion, the preliminary dummy channel enlarged portion, the first sacrificial liner, the first sacrificial gap filler, and the second sacrificial liner through the upper cell channel holes and the upper dummy channel holes.

8. The method of claim 1, further comprising forming a mask pattern covering the cell area and exposing the extension area, before forming the cell channel hole enlarged portion and the dummy channel hole enlarged portion.

9. The method of claim 8, wherein forming the cell channel hole enlarged portion and the dummy channel hole enlarged portion further includes:
forming a preliminarily dummy channel hole enlarged portion by partially removing the middle interlayer dielectric layer in the extension area;
removing the mask pattern; and
finally forming the cell channel hole enlarged portion and the dummy channel hole enlarged portion by partially removing the middle interlayer dielectric layer.

10. The method of claim 1, wherein:
the first sacrificial liner includes silicon nitride; and
the first sacrificial gap filler includes polysilicon.

11. The method of claim 1, wherein:
the second sacrificial liner includes silicon nitride; and
the spacers include polysilicon.

12. The method of claim 1, wherein the preliminary cell channel enlarged portion and the preliminary dummy channel enlarged portion have different horizontal widths from each other.

13. A method of forming a three-dimensional flash memory device, the method comprising:
providing a substrate including a cell area and an extension area;
forming a preliminary lower word line stack, a lower interlayer dielectric layer, a middle interlayer dielectric layer and a protective insulating layer on the substrate;
forming lower cell channel holes and lower dummy channel holes vertically penetrating the preliminary lower word line stack, the lower interlayer dielectric layer, the middle interlayer dielectric layer, and the protective insulating layer;
forming a first sacrificial gap filler filling each of the lower cell channel holes and the lower dummy channel holes;
partially removing an upper portion of the first sacrificial gap filler;
forming cell channel hole enlarged portion and dummy channel hole enlarged portion by partially removing the middle interlayer dielectric layer;
removing the protective insulating layer;
forming spacers on sidewalls of the cell channel hole enlarged portion and the dummy channel hole enlarged portion;
forming a preliminary cell channel enlarged portion and a preliminary dummy channel enlarged portion in the cell channel hole enlarged portion and the dummy channel hole enlarged portion, respectively;
forming an upper interlayer dielectric layer, a preliminary upper word line stack, and a lower capping insulating layer on the middle interlayer dielectric layer, the preliminary cell channel enlarged portion, and the preliminary dummy channel enlarged portion; and
forming cell channel holes in the cell area and dummy channel holes in the extension area.

14. The method of claim 13, wherein partially removing the upper portion of the first sacrificial gap filler includes exposing the middle interlayer dielectric layer and the protective insulating layer.

15. The method of claim 13, wherein the protective insulating layer has an etch selectivity with respect to the middle interlayer dielectric layer.

16. The method of claim 13, wherein each of the cell channel hole enlarged portion and the dummy channel hole enlarged portion include an undercut region under the protective insulating layer and a recessed portion inside the lower interlayer dielectric layer.

17. The method of claim 13, further comprising forming a mask pattern covering the protective insulating layer in the cell area and exposing the extension area, before forming the cell channel hole enlarged portion and the dummy channel hole enlarged portion.

18. The method of claim 17, wherein forming the cell channel hole enlarged portion and the dummy channel hole enlarged portion includes:
forming a preliminarily dummy channel hole enlarged portion by partially removing the middle interlayer dielectric layer in the extension area;
removing the mask pattern; and
finally forming the cell channel hole enlarged portion and the dummy channel hole enlarged portion by partially removing the middle interlayer dielectric layer.

19. The method of claim 17, wherein the dummy channel hole enlarged portion is wider than the cell channel hole enlarged portion and deeper than the cell channel hole enlarged portion.

20. A method of forming a three-dimensional flash memory device, the method comprising:
providing a substrate including a cell area and an extension area;
forming a preliminary lower word line stack, a lower interlayer dielectric layer, and a middle interlayer dielectric layer on the substrate;
forming lower cell channel holes and lower dummy channel holes vertically penetrating the preliminary lower word line stack, the lower interlayer dielectric layer, and the middle interlayer dielectric layer, the lower cell channel holes are formed in the cell area, and the lower dummy channel holes are formed in the extension area;

forming a first sacrificial liner covering inner walls of each of the lower cell channel holes and the lower dummy channel holes;

forming a first sacrificial gap filler filling each of the lower cell channel holes and the lower dummy channel holes;

partially removing upper portions of each of the first sacrificial liner and the first sacrificial gap filler;

forming a mask pattern including first openings exposing the lower cell channel holes and second openings exposing the lower dummy channel holes on an intermediate interlayer insulating layer, a horizontal width of the first openings is wider than a horizontal width of the lower cell channel holes, and a horizontal width of the second openings is wider than a horizontal width of the lower dummy channel holes;

performing an etching process using the mask pattern as an etch mask to form a cell channel hole enlarged portion and a dummy channel hole enlarged portion;

removing the mask pattern;

forming a second sacrificial liner in the cell channel hole enlarged portion and the dummy channel hole enlarged portion;

forming spacers on sidewalls of the cell channel hole enlarged portion and the dummy channel hole enlarged portion;

partially removing the second sacrificial liner to expose the first sacrificial gap filler;

forming a preliminary cell channel enlarged portion and a preliminary dummy channel enlarged portion in the cell channel hole enlarged portion and the dummy channel hole enlarged portion, respectively;

forming an upper interlayer dielectric layer, a preliminary upper word line stack, and a lower capping insulating layer on the middle interlayer dielectric layer, the preliminary cell channel enlarged portion, and the preliminary dummy channel enlarged portion; and forming cell channel holes in the cell area and dummy channel holes in the extension area.

* * * * *